United States Patent
Hsieh et al.

(10) Patent No.: US 10,083,863 B1
(45) Date of Patent: Sep. 25, 2018

(54) CONTACT STRUCTURE FOR SEMICONDUCTOR DEVICE

(71) Applicant: Taiwan Semiconductor Manufacturing Co., Ltd., Hsinchu (TW)

(72) Inventors: Yun-Yu Hsieh, Hsinchu (TW); Jeng Chang Her, Tainan (TW); Cha-Hsin Chao, Taipei (TW); Yi-Wei Chiu, Kaohsiung (TW); Li-Te Hsu, Tainan County (TW); Ying Ting Hsia, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/684,257

(22) Filed: Aug. 23, 2017

Related U.S. Application Data

(60) Provisional application No. 62/512,323, filed on May 30, 2017.

(51) Int. Cl.
| | |
|---|---|
| *H01L 21/4763* | (2006.01) |
| *H01L 21/768* | (2006.01) |
| *H01L 29/78* | (2006.01) |
| *H01L 29/66* | (2006.01) |
| *H01L 21/3213* | (2006.01) |

(52) U.S. Cl.
CPC .. *H01L 21/76895* (2013.01); *H01L 21/32134* (2013.01); *H01L 21/76879* (2013.01); *H01L 21/76886* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 5,940,319 A | * | 8/1999 | Durlam | B82Y 10/00 257/E21.665 |
| 2014/0361381 A1 | * | 12/2014 | Hung | H01L 29/458 257/384 |

* cited by examiner

*Primary Examiner* — Thien F Tran
(74) *Attorney, Agent, or Firm* — Sterne, Kessler, Goldstein & Fox P.L.L.C.

(57) ABSTRACT

A method of forming a semiconductor device includes forming a source/drain region on a substrate and forming a first interlayer dielectric (ILD) layer over the source/drain region. The method further includes forming a first conductive region within the first ILD layer, selectively removing a portion of the first conductive region to form a concave top surface of the first conductive region. The method also includes forming a second ILD layer over the first ILD layer and forming a second conductive region within the second ILD layer and on the concave top surface. The concave top surface provides a large contact area, and hence reduced contact resistance between the first and second conductive regions.

20 Claims, 12 Drawing Sheets

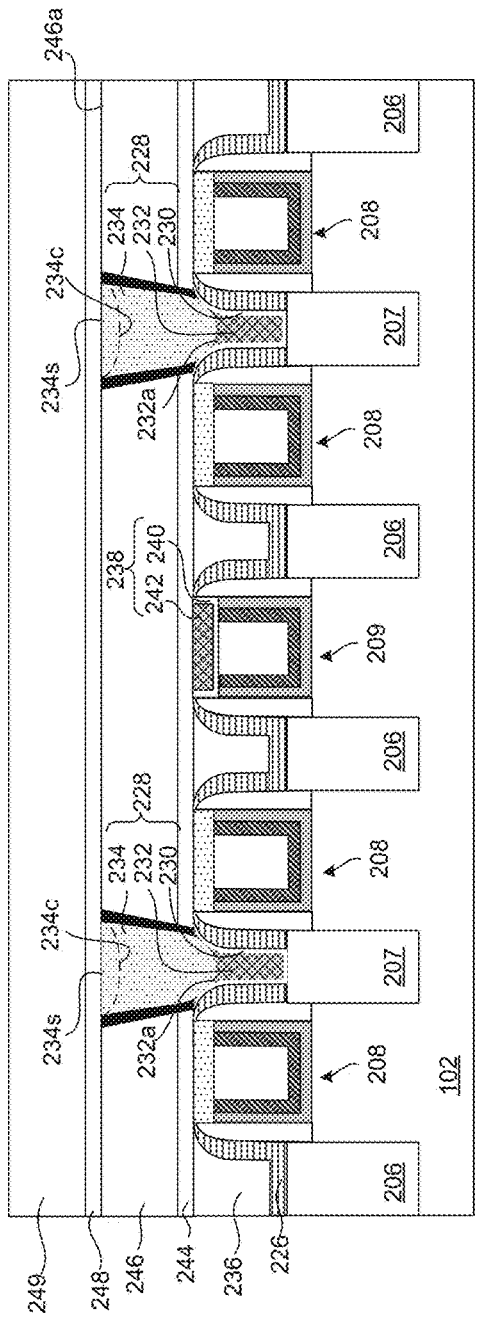
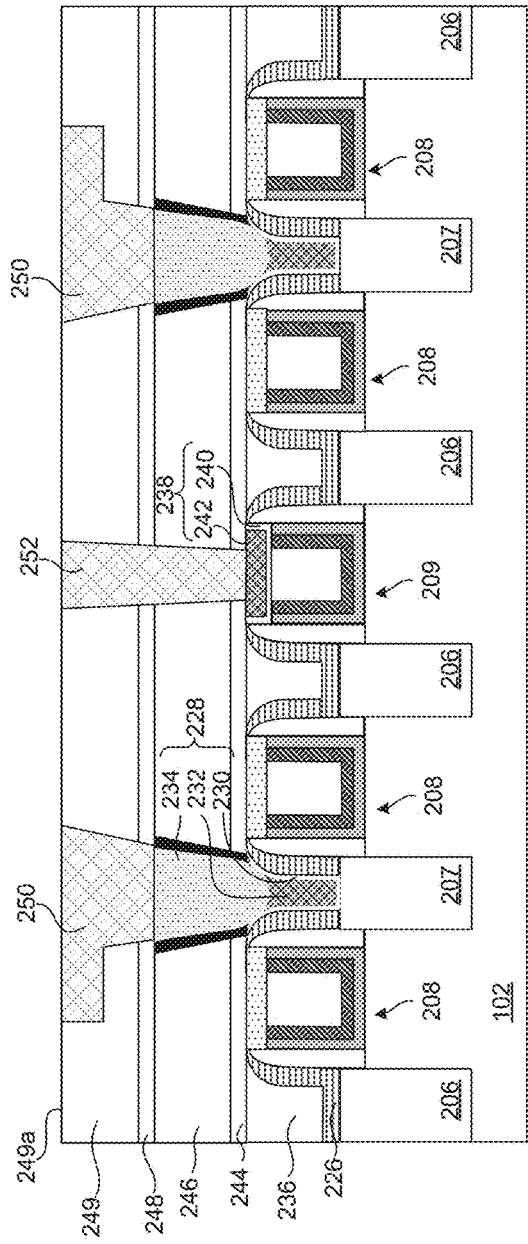

CONTACT STRUCTURE FOR SEMICONDUCTOR DEVICE

CROSS-REFERENCE TO RELATED APPLICATION

This application claims priority to U.S. Provisional Patent Application No. 62/512,323, filed on May 30, 2017, titled "Contact Structure for Semiconductor Device," which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 10-19 are cross-sectional views of a fin field effect transistor (finFET) at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
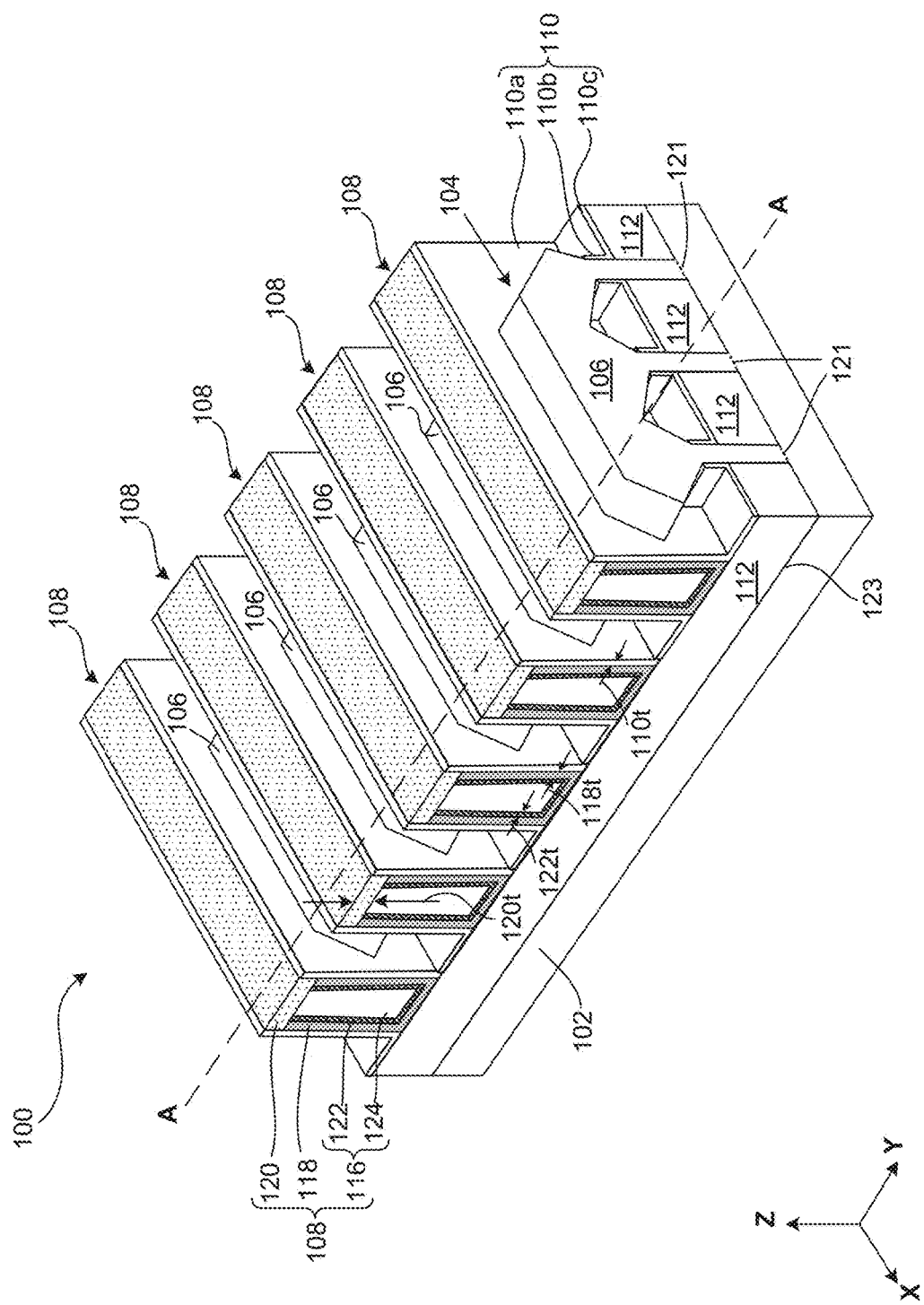
FIG. 1 is an isometric view of a fin field effect transistor (finFET), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "conductive lines" defines horizontal interconnect lines through interlayer dielectric (ILD) layer(s) that electrically connect various elements in a finFET and/or an integrated circuit.

As used herein, the term "conductive vias" defines vertical interconnect lines through ILD layer(s) that electrically connect various elements in a finFET and/or an integrated circuit.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example structures and methods for reducing contact resistance between contact structures of a finFET (e.g., source/drain (S/D) contact structures, gate contact structures) and interconnect(s) (e.g., conductive lines, conductive vias) of an integrated circuit including the finFET. These example structures and methods provide larger contact areas, and thus, reduced contact resistance between the contact structures of finFET and the interconnect(s) without an increase in critical dimensions (e.g., line widths) of the finFET and the interconnect(s) compared to other finFETs.

FIG. 1 is an isometric view of a fin field effect transistor (finFET) 100 after a gate replacement process, according to some embodiments. FinFET 100 may be included in a microprocessor, memory cell, or other integrated circuit. A person of ordinary skill in the art will recognize that the view of finFET 100 in FIG. 1 is shown for illustration purposes and may not be drawn to scale.

FinFET 100 may be formed on a substrate 102 and may include a fin structure 104 having fin regions (not shown in FIG. 1; shown in FIG. 6) and source/drain (S/D) regions 106, gate structures 108 disposed on corresponding one of fin regions of fin structure 104, spacers 110 disposed on opposite sides of each of gate structures 108, and shallow trench isolation (STI) regions 112. FIG. 1 shows five gate structures 108. However, based on the disclosure herein, a person of ordinary skill in the art will recognize that finFET may have additional gate structures similar and parallel to gate structures 108 or may have a single gate structure similar to gate structures 108. In addition, finFET 100 may be incorporated into the integrated circuit through the use of other structural components such as source/drain (S/D) contact structures, gate contact structures, conductive vias, conductive lines, dielectric layers, passivation layers, etc., that are omitted for the sake of clarity.

Substrate 102 may be physical material on which finFET 100 is formed. Substrate 102 may be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

Fin structure 104 represent current carrying structures of finFET 100 and may traverse along a Y-axis and through gate structures 108. Fin structure 104 may include: (i) fin regions underlying corresponding one of gate structures 108; and (ii) S/D regions 106 disposed on opposing sides of each of gate structures 108. Fin regions of fin structure 104 may extend above STI regions 112 and may be wrapped around by corresponding one of gate structures 108. Fin regions may be formed from patterned portions of substrate 102. S/D regions 106 may form interfaces 121 with substrate 102 and interfaces (not shown in FIG. 1; shown as 221 in FIG. 2) with fin regions under gate structures 108. In some embodiments, interfaces 121 are coplanar with interfaces 123 formed between STI regions 112 and substrate 102. In some embodiments, interfaces 121 are either above or below the level of interfaces 123.

Fin regions of fin structure 104 may include material similar to substrate 102. S/D regions 106 may include epitaxially-grown semiconductor material. In some embodiments, the epitaxially-grown semiconductor material is the same material as the material of substrate 102. In some embodiments, the epitaxially-grown semiconductor material includes a different material from the material of substrate 102. The epitaxially-grown semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. Based on the disclosure herein, a person of ordinary skill in the art will recognize that other materials for fin structure 104 are within the scope and spirit of this disclosure.

In some embodiments, S/D regions 106 may be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or a suitable CVD; (ii) molecular beam epitaxy (MBE) processes; (iii) a suitable epitaxial process; or (iv) a combination thereof. In some embodiments, S/D regions 106 may be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 may be grown by selective epitaxial growth (SEG), where an etching gas is added to promote the selective growth of semiconductor material on the exposed surfaces of fin structures, but not on insulating material (e.g., dielectric material of STI regions 112). Based on the disclosure herein, a person of ordinary skill in the art will recognize that other methods for epitaxially growing S/D regions 106 are within the scope and spirit of this disclosure.

S/D regions 106 may be p-type regions or n-type regions. In some embodiments, p-type S/D regions 106 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S/D regions 106 may include Si and may be in-situ doped during an epitaxial growth process using n-type dopants such as, for example, phosphorus or arsenic. For n-type in-situ doping, n-type doping precursors such as, but not limited to, phosphine (PH$_3$), arsine (AsH$_3$), and/or other n-type doping precursor can be used. In some embodiments, S/D regions 106 are not in-situ doped, and an ion implantation process is performed to dope S/D regions 106.

Each of gate structures 108 may include a gate electrode 116, a dielectric layer 118 adjacent to and in contact with gate electrode 116, and a gate capping layer 120. Gate structures 108 may be formed by a gate replacement process.

In some embodiments, dielectric layer 118 may have a thickness 118$t$ in a range of about 1 nm to about 5 nm. Dielectric layer 118 may include silicon oxide and may be formed by CVD, atomic layer deposition (ALD), physical vapor deposition (PVD), e-beam evaporation, or other suitable process. In some embodiments, dielectric layer 118 may include (i) a layer of silicon oxide, silicon nitride, and/or silicon oxynitride, (ii) a high-k dielectric material such as, for example, hafnium oxide (HfO$_2$), TiO$_2$, HfZrO, Ta$_2$O$_3$, HfSiO$_4$, ZrO$_2$, ZrSiO$_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 118 may include a single layer or a stack of insulating material layers. Based on the disclosure herein, a person of ordinary skill in the art will recognize that other materials and formation methods for dielectric layer 118 are within the scope and spirit of this disclosure.

Gate electrode 116 may include a gate work function metal layer 122 and a gate metal fill layer 124. In some embodiments, gate work function metal layer 122 is disposed on dielectric layer 118. Gate work function metal layer 122 may include a single metal layer or a stack of metal layers. The stack of metal layers may include metals having work functions similar to or different from each other. In some embodiments, gate work function metal layer 122 may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate work function metal layer 122 may be formed using a suitable process such as ALD, CVD, PVD, plating, or combinations thereof. In some embodiments, gate work function metal layer 122 has a thickness 122$t$ in a range from about 2 nm to about 15 nm. Based on the disclosure herein, a person of ordinary skill in the art will recognize that other materials, formation methods, and thicknesses for gate work function metal layer 122 are within the scope and spirit of this disclosure.

Gate metal fill layer 124 may include a single metal layer or a stack of metal layers. The stack of metal layers may include metals different from each other. In some embodiments, gate metal fill layer 124 may include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 may be formed by ALD, PVD, CVD, or other suitable deposition process. Based on the disclosure herein, a person of ordinary skill in the art will recognize that other materials and formation methods for gate metal fill layer 124 are within the scope and spirit of this disclosure.

In some embodiments, gate capping layer 120 may have a thickness 120$t$ in a range from about 5 nm to about 50 nm and may be configured to protect gate structure 108 during subsequent processing of finFET 100. Gate capping layer 120 may include nitride material such as, for example, silicon nitride, silicon-rich nitride, and/or silicon oxynitride. Based on the disclosure herein, a person of ordinary skill in the art will recognize that other materials for gate capping layer 120 are within the scope and spirit of this disclosure.

Spacer 110 may include spacer portions 110$a$ that form sidewalls of gate structure 108 and are in contact with dielectric layer 118, spacer portions 110$b$ that form sidewalls of fin structure 104, and spacer portions 110$c$ that form protective layers on STI regions 106. Spacers 110 may include insulating material such as, for example, silicon oxide, silicon nitride, a low-k material, or a combination thereof. Spacers 110 may have a low-k material with a dielectric constant less than 3.9 (e.g., less than 3.5, 3, or 2.8). In some embodiments, each of spacers 110 may have a thickness 110$t$ in a range from about 7 nm to about 10 nm. Based on the disclosure herein, a person of ordinary skill in the art will recognize that other materials and thicknesses for spacers 110 are within the scope and spirit of this disclosure.

STI regions 112 may provide electrical isolation to finFET 100 from neighboring active and passive elements (not illustrated herein) integrated with or deposited onto substrate 102. STI regions 112 may have a dielectric material such as, for example, silicon oxide, silicon nitride, silicon oxynitride, fluorine-doped silicate glass (FSG), a low-k dielectric material, and/or other suitable insulating material. In some embodiments, STI regions 112 may include a multi-layered structure.

Based on the disclosure herein, a person of ordinary skill in the art will recognize that cross-sectional shapes of fin structure 104, S/D regions 106, gate structures 108, spacers 110, and STI regions 112 are illustrative and are not intended to be limiting.

Figure 2:
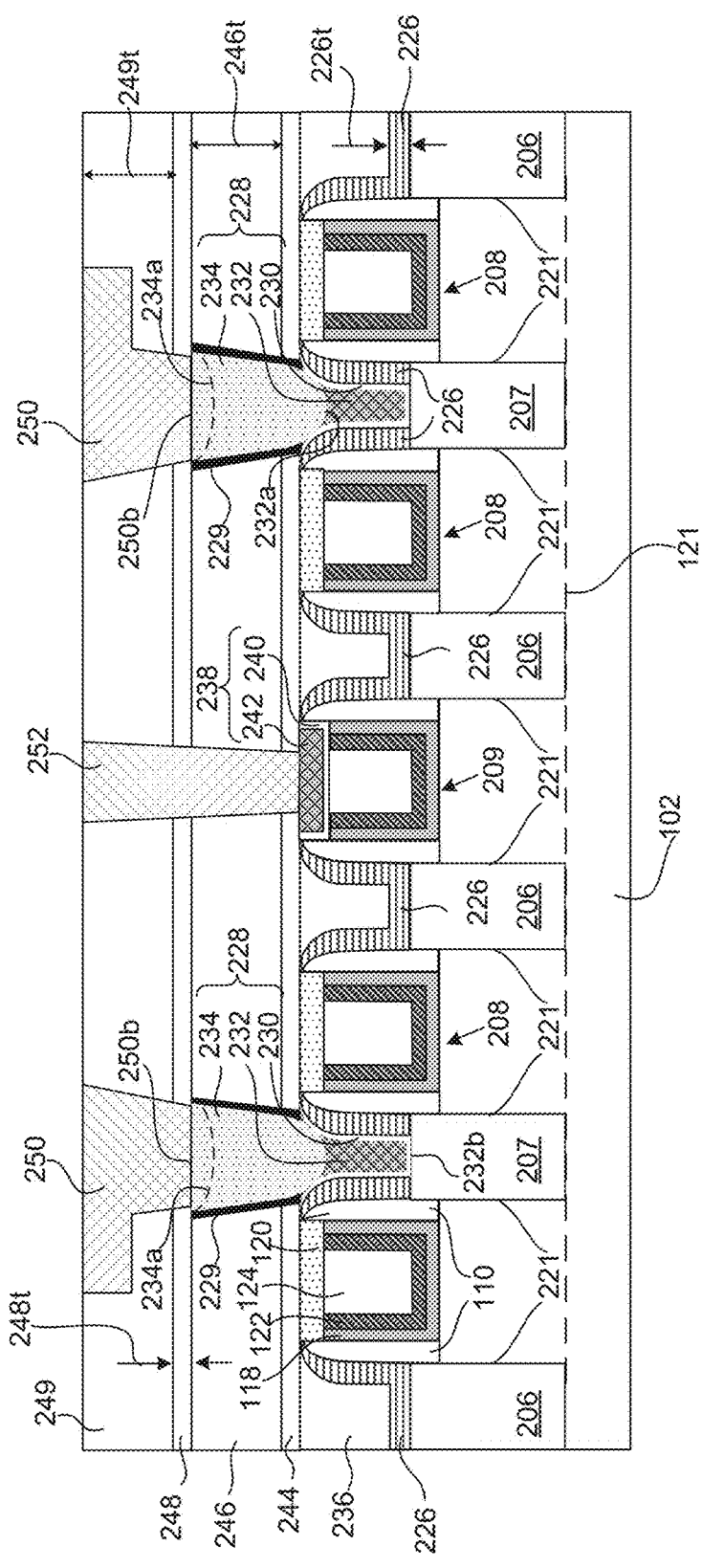
FIGS. 2-3 are cross-sectional views of a fin field effect transistor (finFET), in accordance with some embodiments.

FIG. 2 is a cross-sectional view along line A-A of finFET 100 of FIG. 1, according to some embodiments. Elements in FIG. 2 with the same annotations as elements in FIG. 1 are described above. The above discussion of S/D regions 106 applies to S/D regions 206 and 207 and the discussion of gate structure 108 applies to gate structure 209 unless mentioned otherwise. FIG. 2 describes additional structures of finFET 100 (e.g., first, second, and third etch stop layers 226, 244, and 248, first, second, and third interlayer dielectric (ILD) layers 236, 246, and 249, S/D contact structures 228, spacers 229, gate contact structure 238) and interconnects 250 and 252 that may electrically connect finFET 100 to other elements of an integrated circuit (not shown) including finFET 100, according to some embodiments. A person of ordinary skill in the art will recognize that the view of device 100 in FIG. 2 is shown for illustration purposes and may not be drawn to scale.

A first etch stop layer 226 may be configured to protect source/drain (S/D) regions 206 and 207 and/or gate structures 108 and 209, for example, during formation of S/D contact structures 228. Etch stop layer 226 may be disposed on sides of spacers 110 and on S/D regions 206 and 207. In some embodiments, etch stop layer 226 may include, for example, SiN$_x$, SiO$_x$, SiON, SiC, SiCN, BN, SiBN, SiCBN, or a combination thereof. In some embodiments, etch stop layer 226 may include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, etch stop layer 226 has a thickness 226t in a range from about 20 nm to 200 nm or from about 20 nm to about 100 nm. Based on the disclosure herein, a person of ordinary skill in the art will recognize that other materials, formation methods, and thicknesses for etch stop layer 226 are within the scope and spirit of this disclosure.

A first ILD layer 236 may be disposed on etch stop layer 226 and may include a dielectric material. The dielectric material of ILD layer 236 may be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 228 using flowable CVD (FCVD). In an embodiment, the dielectric material is silicon oxide. Based on the disclosure herein, a person of ordinary skill in the art will recognize that other materials and formation methods for ILD 236 are within the scope and spirit of this disclosure.

S/D contact structures 228 may be configured to electrically connect S/D regions 207 to other elements of finFET 100 and/or of the integrated circuit. S/D contact structures 228 may be disposed on and in contact with top surfaces of S/D regions 207. In some embodiments, each of S/D contact structures 228 may include a conductive liner 230, a first conductive region 232, and a second conductive region 234. First conductive region 232 may be formed within first ILD layer 236 and second conductive region 234 may be formed in second ILD layer 246.

In some embodiments, conductive liner 230 may be configured as a diffusion barrier to prevent diffusion of unwanted atoms and/or ions into S/D regions 207 during formation of first and second conductive regions 232 and 234. In some embodiments, conductive liner 230 may include a single layer or a stack of conductive materials such as, for example, TiN, Ti, Ni, TaN, Ta, or a combination thereof. In some embodiments, conductive liner 230 may act as an adhesion-promoting-layer, a glue-layer, a primer-layer, a protective-layer, and/or a nucleation-layer. Conductive liner 230 may have a thickness in a range from about 1 nm to about 2 nm, according to some embodiments.

In some embodiments, first and second conductive regions 232 and 234 may include a conductive material such as, for example, W, Al, Co, or Cu. First and second conductive regions 232 and 234 may have different conductive materials with respect to each other and may be deposited in different processing steps with respect to each other, according to some embodiments. In some embodiments, first and second conductive regions 232 and 234 may each have an average horizontal dimension (e.g., width) in a range from about 15 nm to about 25 nm and may each have an average vertical dimension (e.g., height) in a range from about 400 nm to about 600 nm. Based on the disclosure herein, a person of ordinary skill in the art will recognize that other materials and dimensions for conductive liners 230, first conducive regions 232, and second conductive regions 234 are within the scope and spirit of this disclosure.

S/D contact structures 228 may have non-planar (e.g., concavely curved) interfaces 232a between first and second conductive regions 232 and 234, according to some embodiments. Non-planar (e.g., concavely curved) interfaces 232a may be a result of concave top surfaces of first conductive regions 232 formed prior to the formation of second conductive regions 234. The concave top surfaces of first conductive regions 232 may provide larger contact areas between first and second conductive regions 232 and 234 compared to contact areas provided by planar top surfaces of first conductive regions of other S/D contact structures (not shown). The larger contact areas may help to reduce contact resistance between first and second conductive regions, and consequently, improve electrical conductance of S/D contact structures 228.

Based on the disclosure herein, a person of ordinary skill in the art will recognize that S/D contact structures 228 may be formed on other S/D regions (e.g., on S/D regions 206) of finFET 100. In some embodiments, S/D regions 206 are not connected to conductive structures such as, for example S/D contact structures 228, and may be electrically insulated from other elements of finFET 100 and/or of the integrated circuit. In some embodiments, a metal silicide may be formed at interface between first conductive regions 232 and S/D regions 207.

Additionally or optionally, spacers 229 may be disposed on sidewalls of second conductive regions 234. Spacers 229 may have nitride material such as, for example, silicon nitride. In some embodiments, spacers 229 may be configured to control horizontal dimensions (e.g., dimensions along Y-axis) of second conductive regions 234 by reducing volume of contact openings in which second conductive regions 234 are deposited. Spacers 229 may be formed along sidewalls of the contact openings (as shown in FIG. 14) prior to deposition of second conductive regions 234.

Gate contact structures 238 may be configured to electrically connect gate structure 209 to other elements of finFET 100 and/or of the integrated circuit. Gate contact structure 238 may be disposed on and in contact with dielectric layer 118, gate work function metal layer 122, and gate metal fill layer 124 of gate structure 209. Gate contact structure 238 may include a conductive liner 240 and a conductive region 242, which may be similar in composition to conductive liner 230 and first conductive region 232, respectively. In some embodiments, conductive liner 240 and a conductive region 242 may be formed in the same processing steps as conductive liner 230 and first conductive region 232, respectively. Based on the disclosure herein, a person of ordinary skill in the art will recognize that gate contact structures 238 may be formed on other gate structures (e.g., on gate structures 108) of finFET 100. In some embodiments, gate structures 108 are not connected to conductive structures such as, for example, gate contact structures 238 and may be electrically insulated from other elements of finFET 100 and/or of the integrated circuit.

FinFET 100 may further include a second etch stop layer 244, a second ILD layer 246, a third etch stop layer 248, and a third ILD layer 249. Second and third etch stop layers 244 and 248 may be optional and may be similar in composition and thickness to first etch stop layer 226, according to some embodiments. In some embodiments, second and third etch stop layers 244 and 248 may each have a thickness 248t in a range from about 5 nm to about 10 nm. Second etch stop layer 244 may be disposed on first ILD layer 236 and gate structures 108 and 209. Second ILD layer 246 may be disposed on second etch stop layer 244 and may have a thickness 246t in a range from about 500 nm to about 600 nm. Third etch stop layer 248 may be disposed on second ILD layer 246. Third ILD layer 249 may be disposed on third etch stop layer 248 and may have a thickness 249t in a range from about 500 nm to about 600 nm. In some embodiments, second and third ILD layers 246 and 249 may be similar in composition to first ILD layer 236. In some embodiments, second ILD layer 246 may include a dielectric material such as, for example, silicon oxycarbide, TEOS oxide, or a combination thereof. In some embodiments, third ILD layer 249 may include a low-k dielectric material having a k value less than about 3.0 (e.g., about 2.5).

In some embodiments, S/D contact structures 228 and gate contact structure 238 may be electrically connected to respective interconnects 250 and 252. Interconnects 250 may each include a conductive line and a conductive via that are formed as a dual-damascene structure within third ILD layer 249, and hence there is no noticeable interface between conductive lines and conductive vias of interconnects 250. In some embodiments, there may be planar interfaces 250b or curve interfaces 234a between interconnects 250 and second conductive regions 234. Non-planar (e.g., concavely curved) interfaces 234a may be formed as a result of concave top surfaces of second conductive regions 234 formed prior to formation of interconnects 250. Similar to above discussed non-planar (e.g., concavely curved) interfaces 232a, non-planar (e.g., concavely curved) interfaces 234a may provide larger contact areas between second conductive regions 234 and interconnects 250 compared to contact areas provided by planar interfaces 250a. The larger contact areas may reduce contact resistance between S/D contact structures 228 and interconnects 250, and consequently, improve electrical conductance between S/D regions 207 and interconnects 250. In some embodiments, interconnect 252 may include a conductive via formed within second and third ILD layers 246 and 249. Interconnects 250 and 252 may include conductive material such as, for example, W, Al, Co, or Cu. Based on the disclosure herein, a person of ordinary skill in the art will recognize that other conductive materials for interconnects 250 and 252 are within the scope and spirit of this disclosure.

Figure 3:
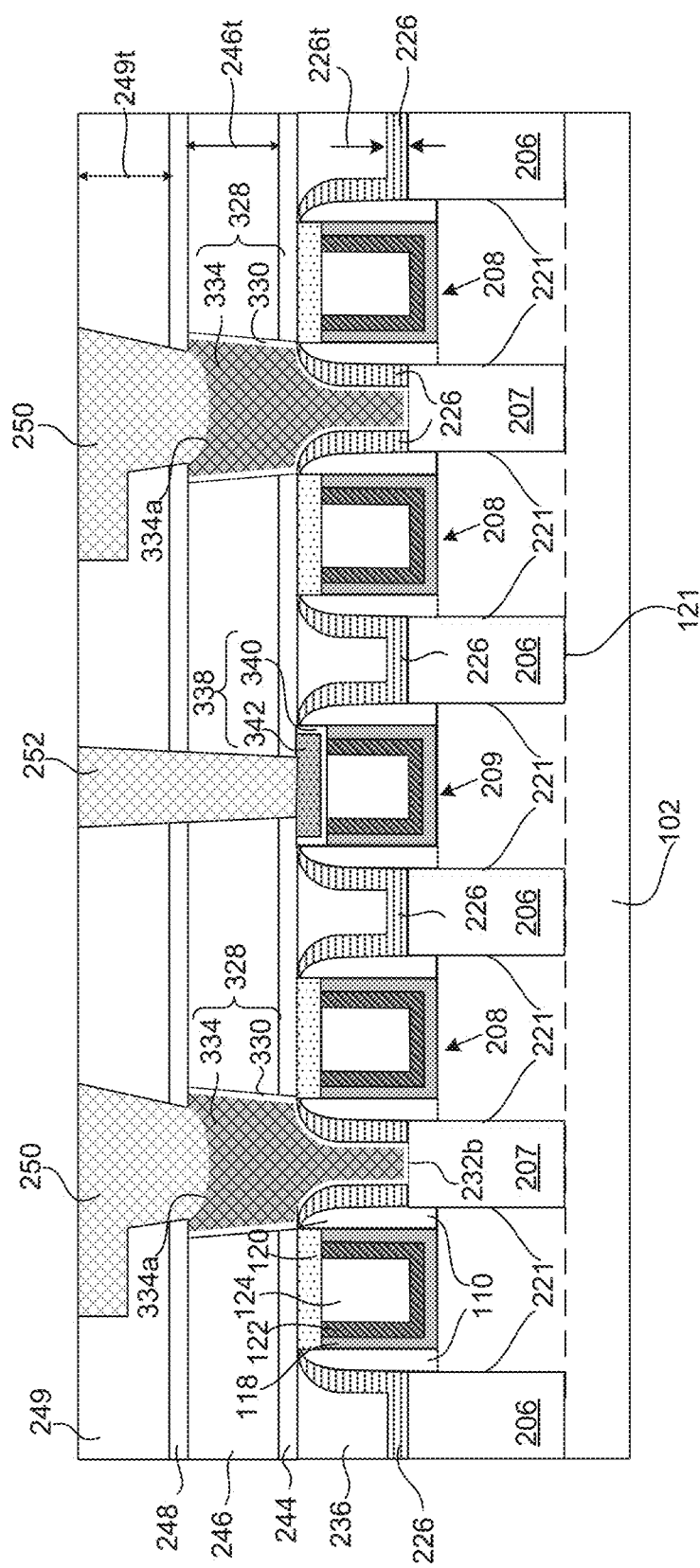

FIG. 3 is another cross-sectional view along line A-A of finFET 100 of FIG. 1, according to some embodiments. Elements in FIG. 3 with the same annotations as elements in FIGS. 1-2 are described above. A person of ordinary skill in the art will recognize that views of device 100 in FIG. 3 is shown for illustration purposes and may not be drawn to scale.

FinFET 100 may include S/D contact structures 328 that may be configured to electrically connect S/D regions 207 to other elements of finFET 100 and/or of the integrated circuit. S/D contact structures 328 may be disposed on and in contact with top surfaces of S/D regions 207. S/D contact structures 328 may be formed within first and second ILD layers 236 and 246. In some embodiments, each of S/D contact structures 328 may include a conductive liner 330 and a conductive region 334. In some embodiments, conductive liner 330 and conductive region 334 may be similar in composition to conductive liner 230 and first conductive region 232, respectively. In some embodiments, conductive regions 334 may each have an average horizontal dimension (e.g., width) in a range from about 15 nm to about 25 nm. Based on the disclosure herein, a person of ordinary skill in the art will recognize that other materials and dimensions for conductive liners 330 and conducive regions 334 are within the scope and spirit of this disclosure.

S/D contact structures 328 may have non-planar (e.g., concavely curved) interfaces 334a between conductive regions 334 and interconnects 250, according to some embodiments. Non-planar (e.g., concavely curved) interfaces 334a may be formed as a result of concave top surfaces of second conductive regions 334 formed prior to formation of interconnects 250. In some embodiments, non-planar (e.g., concavely curved) interfaces 334a may have similar benefits as above discussed non-planar (e.g., concavely curved) interfaces 234a. Based on the disclosure herein, a person of ordinary skill in the art will recognize that S/D contact structures 328 may be formed on other S/D regions (e.g., on S/D regions 206) of finFET 100. In some embodiments, a metal silicide may be formed at interface between conductive regions 334 and S/D regions 207.

Additionally or optionally, spacers (not shown in FIG. 3) such as, for example, spacers 229 may be disposed on sidewalls of conductive regions 334.

Gate contact structure 338 may be disposed on and in contact with dielectric layer 118, gate work function metal layer 122, and gate metal fill layer 124 of gate structure 209. Gate contact structure 338 may include a conductive liner 340 and a conductive region 342, which may be different in composition from conductive liner 330 and conductive region 334, respectively. In some embodiments, gate contact structure 338 may be formed in different processing steps prior to formation of S/D contact structures 328.

Based on the disclosure herein, a person of ordinary skill in the art will recognize that S/D contact structures 228 and/or 328 may be formed on planar S/D regions of, for example, MOSFETs, which may have similar ILD layers 236, 246, 249, etch stop layers 226, 244, and 248, and interconnects 250. The planar S/D regions of MOSFETs may be formed in a substrate (e.g., substrate 102) and between gate structures of MOSFETs.

FIGS. 4-15 illustrate fabrication of finFET 100 as described with reference to FIGS. 1-2. FIGS. 4-9 are isometric views of finFET 100 at various stages of its fabrication, according to some embodiments. FIGS. 10-16 are cross-sectional views of finFET 100 at various stages of its fabrication, according to some embodiments.

Figure 4:
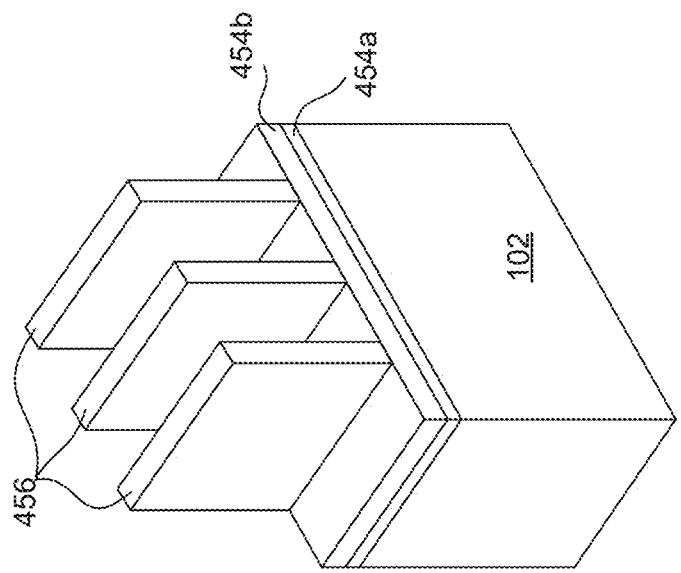

FIG. 4 is an isometric view of partially fabricated finFET 100 after patterning of photoresist on substrate 102, according to some embodiments. Fin structure 104 may be formed by etching into substrate 102. A pad layer 454a and a hard mask layer 454b may be formed on substrate 102. Pad layer 454a may be a thin film including silicon oxide formed, for example, using a thermal oxidation process. Pad layer 454a may also act as an etch stop layer for etching hard mask layer 454b. In an embodiment, hard mask layer 454b may be formed of silicon nitride using, for example, low pressure chemical vapor deposition (LPCVD) or plasma enhanced CVD (PECVD). Hard mask layer 454b may be used as a hard mask during subsequent photolithography processes. A patterned photoresist layer 456 may be formed on hard mask layer 454b.

Figure 5:
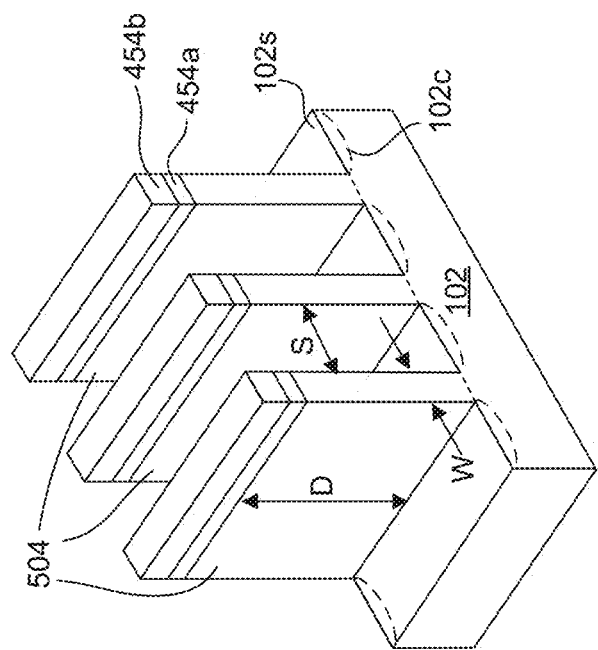
FIGS. 4-9 are isometric views of a fin field effect transistor (finFET) at various stages of its fabrication process, in accordance with some embodiments.

FIG. 5 is an isometric view of partially fabricated finFET 100 after the formation of fin regions 504, according to some embodiments. Portions of hard mask layer 454b and pad layer 454a that are not covered by patterned photoresist layer 456 may be etched to expose underlying substrate 102. The exposed substrate 102 may then be etched to form fin regions 504. Patterned photoresist 456 may then be removed. In some embodiments, fin regions 504 each may have fin widths W less than about 30 nm and depth D in a range from about 210 nm to about 250 nm, while spacing S between fin regions 504 may be less than about 50 nm. In some embodiments, top surface of substrate 102 may be planar as surface 102s or curved as surface 102c depending on the etching process used to form fin regions 504.

Figure 6:
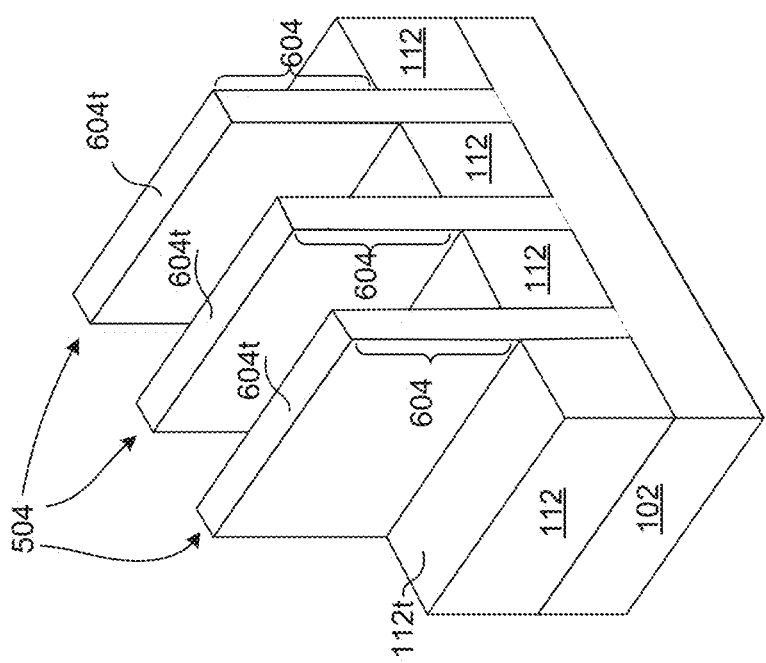

FIG. 6 is an isometric view of partially fabricated finFET 100 after the formation of shallow trench isolation (STI) regions 112, according to some embodiments. Formation of STI regions 112 may involve blanket deposition of a dielectric material on fin regions 504 and substrate 102. The blanket deposition may be followed by etching of the deposited dielectric material to form STI regions 112 as shown in FIG. 6. In some embodiments, the dielectric material may include, for example, silicon oxide, silicon nitride, silicon oxynitride, fluoride-doped silicate glass (FSG), or a low-k dielectric material. In some embodiments, the dielectric material may be formed using a flowable chemical vapor deposition (FCVD) process, a high-density-plasma (HDP) CVD process, using silane ($SiH_4$) and oxygen ($O_2$) as reacting precursors. In some embodiments, the dielectric material may be formed using a sub-atmospheric CVD (SACVD) process or high aspect-ratio process (HARP), where process gases may include tetraethoxysilane (TEOS) and/or ozone ($O_3$). In some embodiments, the dielectric material may be formed using a spin-on-dielectric (SOD) such as, for example, hydrogen silsesquioxane (HSQ) or methyl silsesquioxane (MSQ).

Etching the dielectric material may be performed using a wet etching process by, for example, dipping substrate 102 in hydrofluoric acid (HF). Alternatively, the etching operation may be performed using a dry etching process using, for example, $CHF_3$ or $BF_3$ as etching gases. Upper fin portions 604 of fin regions 504, protruding over flat top surfaces 112t of STI regions 112 may be used to form channel regions of finFET 100. Upper fin portions 604 may include top surfaces 604t. In some embodiments, flat top surfaces 112t of STI regions 112 may be lower than top surfaces 604t. In some embodiments, a vertical dimension of each of the upper fin portions 604 may be in a range from about 15 nm to about 50 nm, from about 20 nm to about 40 nm, or from about 25 nm to about 35 nm. Based on the disclosure herein, a person of ordinary skill in the art will recognize that other vertical dimensions for upper fin portions 604 are within the scope and spirit of this disclosure.

Figure 7:
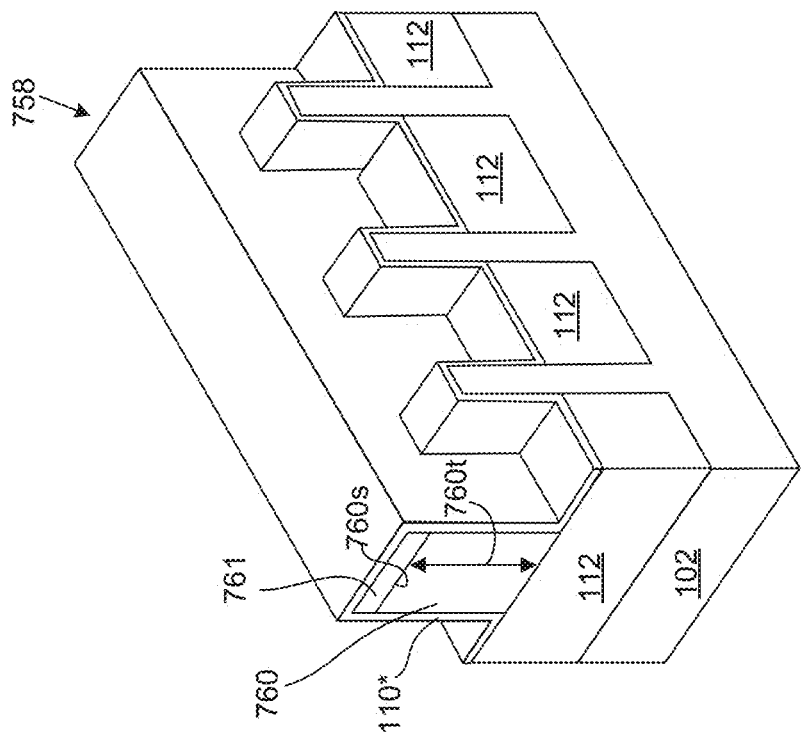

FIG. 7 is an isometric view of a partially fabricated finFET 100 after the formation of a structure 758 on fin regions 604 and STI regions 112, according to some embodiments. Structure 758 may include a patterned polysilicon structure 760, a hard mask 761, and an unpatterned spacer 110*. Patterned polysilicon structure 760 may be formed over top surfaces 112t of STI regions 112 and wrapped around surfaces of fin regions 604 protruding over STI regions 112. In some embodiments, a vertical dimension 760t of patterned polysilicon structure 760 may be in a range from about 90 nm to about 200 nm. In some embodiments, patterned polysilicon structure 760 and hard mask 761 may be replaced in a gate replacement process during subsequent processing of finFET 100 to form one of gate structures 108. Based on the disclosure herein, a person of ordinary skill in the art will recognize that other structures similar to structure 758 may be formed that may be replaced in a gate replacement process during subsequent processing of fin-FET 100 to form gate structures 108.

Hard mask 761 includes insulating material such as, for example, silicon nitride that may be disposed over top surface 760s of patterned polysilicon structure 760. Unpatterned spacer 110* may be blanket deposited on partially formed finFET 100 of FIG. 7 to cover exposed surfaces of patterned polysilicon 760 and hard mask 761. Unpatterned spacer 110* may also cover top surfaces 112t and surfaces of fin regions 604 protruding over STI regions 112 that are not covered by patterned polysilicon structure 760. The material of unpatterned spacer 110* may include (i) a dielectric material such as, for example, silicon oxide, silicon carbide, silicon nitride, silicon oxy-nitride, (ii) an oxide material, (iii) an nitride material, (iv) a low-k material, or (v) a combination thereof.

In some embodiments, patterned polysilicon structure 760 may be formed by a process including deposition, photolithography, and etching. Deposition processes may include chemical vapor deposition (CVD), physical vapor deposition (PVD), atomic layer deposition (ALD), other suitable deposition methods, or a combination thereof. Photolithography may include photoresist coating (e.g., spin-on coating), soft baking, mask aligning, exposure, post-exposure baking, developing the photoresist, rinsing, drying (e.g., hard baking), other suitable processes, or a combination thereof. Etching processes may include dry etching, wet etching, and/or other etching methods (e.g., reactive ion etching). Unpatterned spacer 110* may include dielectric material such as, for example, silicon oxide, silicon carbide, silicon nitride, silicon oxy-nitride, or other suitable material. A blanket layer of a dielectric material may be formed by CVD, PVD, ALD, or other suitable technique.

Figure 8:
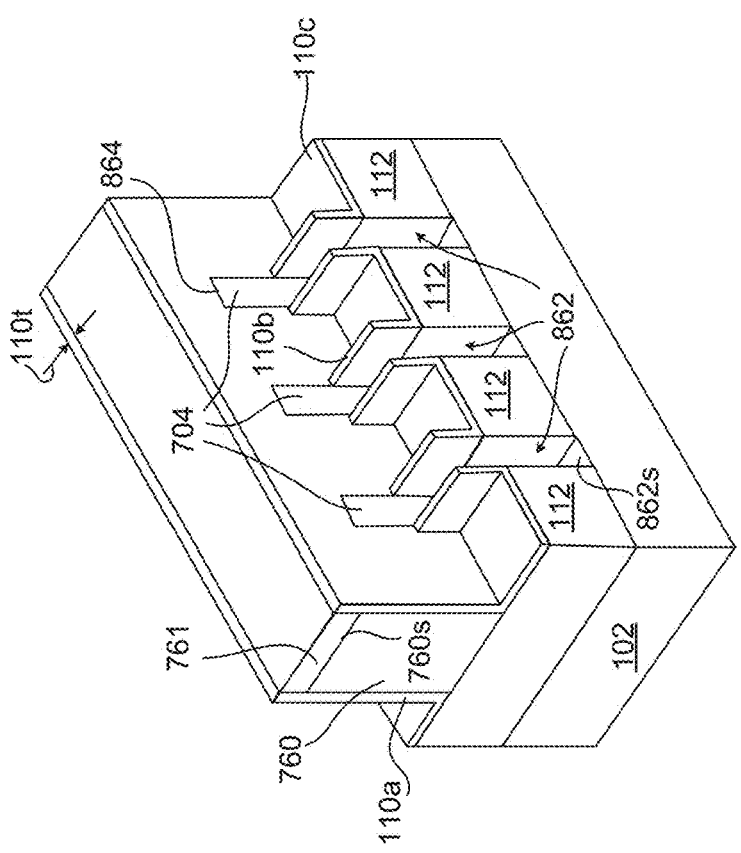

FIG. 8 is an isometric view of partially fabricated finFET 100 after the formation of spacers 110 and recessed fin regions 862, according to some embodiments. Unpatterned spacer 110* may be dry etched using, for example, reactive ion etching (RIE) or other dry etching process using a chlorine or fluorine based etchant to form spacers 110 having spacer portions 110a, 110b, and 110c as shown in FIG. 8. Spacer 110 may have a thickness 110t in a range from 5 nm to 15 nm, according to some embodiments. The portions of fin regions 604 that are not covered by patterned polysilicon structure 760 and spacer portions 110a may be recessed to form recessed fin regions 862. The unrecessed portions of fin regions 604 may underlie spacer portions 110a and patterned polysilicon structure 760 and form interfaces 864 with spacer portions 110a and patterned polysilicon structure 760. In some embodiments, a biased etching process may be performed to form recessed fin regions 862. The etching process may be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, top surface 760s of patterned polysilicon structure 760 may be protected from being etched by hard mask 761.

Figure 9:
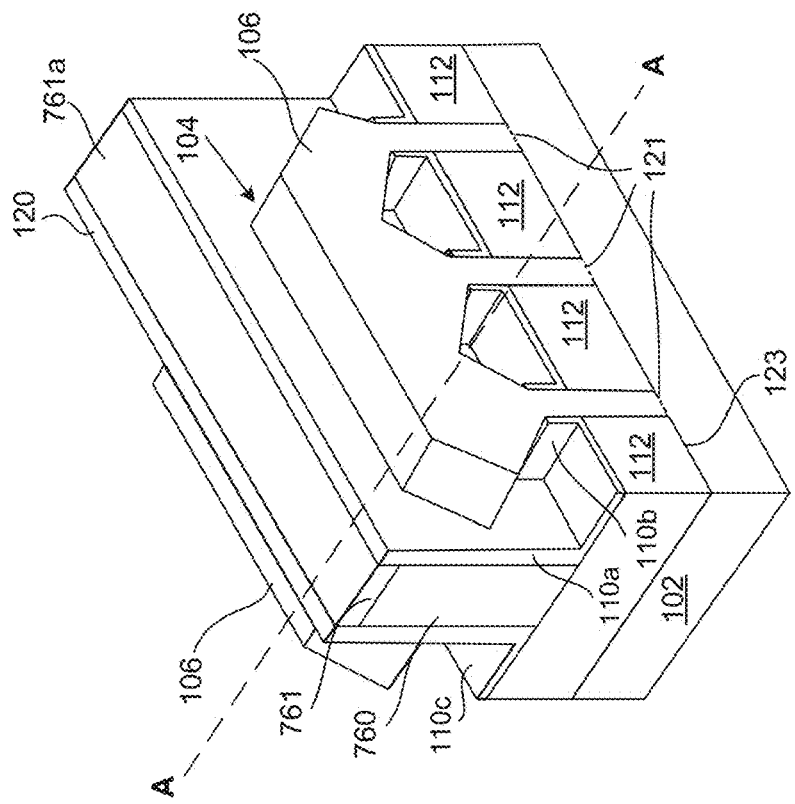

FIG. 9 is an isometric view of a partially fabricated finFET 100 after the formation of S/D regions 106 on recessed fin portions 862, according to some embodiments. S/D regions 106 may include epitaxially-grown semiconductor material. Semiconductor material of S/D regions 106 may be selectively epitaxially-grown over recessed portions 862. In some embodiments, the selective epitaxial growth of the semiconductor material of S/D regions 106 may continue until the semiconductor material extends vertically a distance in a range from about 10 nm to about 100 nm above top surface 102s of substrate 102 and extends laterally over top surfaces 112t of some of STI regions 112. The semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide.

The epitaxial processes for growing the semiconductor material may include CVD deposition techniques (e.g., LPCVD, vapor-phase epitaxy (VPE), and/or ultra-high vacuum CVD (UHV-CVD)), molecular beam epitaxy, and/or other suitable processes. In some embodiments, the semiconductor material such as, for example, silicon carbide (SiC) may be epitaxially grown by a LPCVD process to form n-type S/D regions 106. The LPCVD process for n-type S/D regions 106 may be performed at a temperature of about 400 to about 800° C. and under a pressure of about 1 Torr to about 200 Torr, using $Si_3H_8$ and $SiH_3CH$ as reaction gases. In some embodiments, the semiconductor material such as, for example, silicon germanium (SiGe), may be epitaxially grown by a LPCVD process to form p-type S/D regions 106. The LPCVD process p-type S/D regions 106 may be performed at a temperature of about 400° C. to about 800° C. and under a pressure of about 1 Torr to about 200 Torr, using $SiH_4$ and $GeH_4$ as reaction gases.

In some embodiments, p-type S/D regions 106 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S/D regions 106 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. In some embodiments, S/D regions 106 are not in-situ doped, and an ion implantation process is performed to dope S/D regions 106. One or more annealing processes may be performed to activate S/D regions 106. Annealing processes include but are not limited to rapid thermal annealing (RTA) and/or laser annealing processes.

Figure 10:
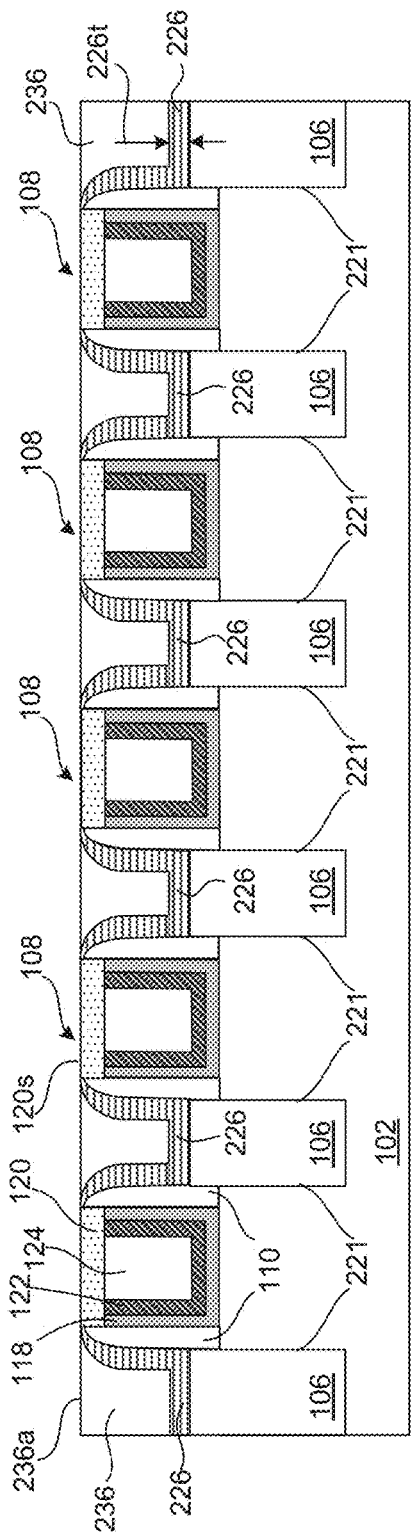

FIG. 10 is a cross-sectional view of the structure of FIG. 9 along line A-A after the formation of first etch stop layer 226, first interlayer dielectric (ILD) layer 236 and gate structures 108, according to some embodiments. Based on the disclosure herein, a person of ordinary skill in the art will understand that additional structures of finFET 100 are shown in FIG. 10 that were not shown in FIG. 9 for the sake of simplicity. Material of first etch stop layer 226 may be blanket deposited on the structure of FIG. 9 using plasma enhanced chemical vapor deposition (PECVD), sub atmospheric chemical vapor deposition (SACVD), low pressure chemical vapor deposition (LPCVD), ALD, high-density plasma (HDP), plasma enhanced atomic layer deposition (PEALD), molecular layer deposition (MLD), plasma impulse chemical vapor deposition (PICVD), or other suitable deposition methods. In some embodiments, first etch stop layer 226 may be formed of materials including $SiN_x$, $SiO_x$, SiON, SiC, SiCN, BN, SiBN, SiCBN, or a combination thereof. In some embodiments, first etch stop layer 226 may have a thickness 226t in a range from about 20 nm to 200 nm or from about 20 nm to about 100 nm.

The blanket deposition of the material of first etch stop layer 226 may be followed by a blanket deposition of a dielectric material of first ILD layer 236, an annealing of the deposited dielectric material, and a planarization of the annealed dielectric material. The dielectric material of first ILD layer 236 may be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for first ILD layer 236 using FCVD process. A wet anneal process may be performed on the deposited dielectric material of first ILD layer 236. An illustrative wet anneal process may include annealing first ILD layer 236 in steam at a temperature in a range from about 200° C. to about 700° C. for a period in a range from about 30 minutes to about 120 minutes. In some embodiments, the dielectric material is silicon oxide. The wet annealed dielectric material of first ILD layer 236 may then be planarized by chemical mechanical polishing (CMP). CMP of the wet annealed dielectric material may result in first ILD layer 236 having top surface 236a coplanar with top surface 761a of hard mask 761. During the CMP process, a portion of first etch stop layer 226 on hard mask 761 is removed and thus, leaving first etch stop layer 226 on sides of spacers 110 and on top of S/D regions 106 as shown in FIG. 10.

Formation of first ILD layer 236 may be followed by a gate replacement process to replace patterned polysilicon structures 760 and hard mask layers 761 with gate structures 108, according to some embodiments. Patterned polysilicon structure 760 and hard mask layer 761 may be removed by a dry etching process such as, for example, reactive ion etching (RIE). The gas etchants used in dry etching may include, for example, chlorine, fluorine, bromine, and/or combinations thereof. Removal of patterned polysilicon structures 760 and hard mask layers 761 may be followed by formation of gate structures 108 within trenches (not shown) formed between spacers 110 after dry etch of patterned polysilicon structures 760 and hard mask layers 761. In some embodiments, formation of gate structures 108 may include blanket deposition of the materials of dielectric layers 118, gate work function metal layers 122, and gate metal fill layers 124.

In some embodiments, dielectric layer 118 may include silicon oxide and may be formed by CVD, atomic layer deposition (ALD), physical vapor deposition (PVD), e-beam evaporation, or other suitable process. In some embodiments, dielectric layer 118 may include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 118 may include a single layer or a stack of insulating material layers.

In some embodiments, gate work function metal layer 122 may be formed using a suitable process such as ALD, CVD, PVD, plating, or combinations thereof. Gate work function metal layer 122 may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof.

In some embodiments, gate metal fill layer 124 may be formed by ALD, PVD, CVD, or other suitable deposition process. Gate metal fill layer 124 may include a single metal layer or a stack of metal layers. The stack of metal layers may include metals different from each other. In some embodiments, gate metal fill layer 124 may include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. In some embodiments, gate metal fill layer 124 includes substantially fluorine-free (FF) metal film or FF metal-comprising film formed by ALD or CVD using one or more non-fluorine based metal precursors. The substantially FF metal film or FF metal-comprising film may include an amount of fluorine contaminants less than 5 atomic percent in the form of ions, atoms, and/or molecules. The fluorine contaminants may be from other process variables and not from the deposition process of the substantially FF metal film or FF metal-comprising film. In some embodiments, the substantially FF metal film or FF metal-comprising film may include an amount of non-fluorine contaminants or non-fluorine halogen contaminants greater than 3 atomic percent (e.g., about 5 atomic percent, about 7 atomic percent, about 10 atomic percent) in the form of ions, atoms, and/or molecules. In some embodiments, gate metal fill layer 124 includes substantially fluorine-free tungsten (FFW) film or FFW-comprising film having an amount of fluorine contaminants less than 5 atomic percent and an amount of chlorine contaminants greater than 3 atomic percent (e.g., about 5 atomic percent, about 7 atomic percent, about 10 atomic percent). The FFW film or the FFW-comprising film may be formed by ALD or CVD using one or more non-fluorine based W precursors such as, but not limited to, tungsten pentachloride (WCl5), tungsten hexachloride (WCl6).

Deposition of the materials of dielectric layer 118, gate work function metal layer 122, and gate metal fill layer 124 may be followed by a planarization of these deposited materials. Planarization may be performed using a CMP process. In an embodiment, first ILD layer 236 may act as a planarization stop layer during planarizing of these layers. CMP removes excess portions of the materials of dielectric layer 118, gate work function metal layer 122, and gate metal fill layer 124, such that top surfaces of these layers are coplanar with top surface 236s of first ILD layer 236.

Formation of gate structures 108 may further include formation of gate capping layers 120. In some embodiments, formation of gate capping layers 120 include etch back of dielectric layers 118, gate work function metal layers 122, and gate metal fill layers 124 of gate structures 108, deposition of the material of gate capping layers 120, and planarization of excess materials of gate capping layers 120 from top surface 236a. The etch back process may include one or more dry etching, wet etching, and/or plasma etching processes to remove the desired thickness of dielectric layers 118, gate work function metal layers 122, and gate metal fill layers 124. Gate capping layer 120 may include nitride material such as, for example, silicon nitride, silicon-rich nitride, and/or silicon oxynitride and may be deposited, for example, by CVD or ALD. In some embodiments, planarization of deposited materials of gate capping layers 120 may be performed using a CMP process until top surfaces 120s of gate capping layers 120 is coplanar with top surface 236s of first ILD layer 236.

Figure 11:
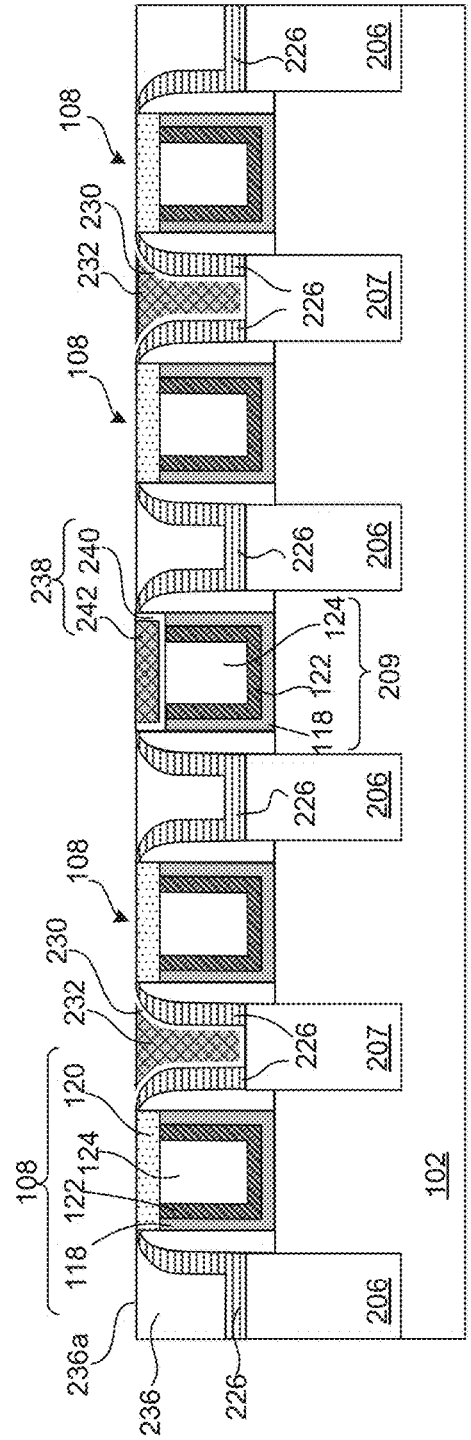

FIG. 11 is a cross-sectional view of a partially fabricated finFET 100 after the formation of gate contact structure 238 and S/D conductive liners 230 and S/D first conductive regions 232 in the structure of FIG. 10, according to some embodiments. For the sake of clarity, S/D regions 106 of FIG. 10 that have S/D conductive liners 230 and first conductive regions 230 formed on them are referenced as S/D regions 207 and the others are referenced as S/D regions 206. The above discussions of S/D regions 106 applies to S/D regions 206 and 207 unless mentioned otherwise.

In some embodiments, formation of gate contact structure 238 and S/D conductive liners 230 and S/D first conductive regions 232 may include (i) removing portions of first ILD layer 236 overlying S/D regions 207, (ii) removing portions of first etch stop layer 226 underlying the etched portion of first ILD layer 236, and (iii) removing gate capping layer 120 of gate structure 208 of FIG. 10 corresponding to gate structure 209 of FIG. 11. Removal of portions of first ILD layer 236 overlying S/D regions 207 may include patterning using photolithography the structure of FIG. 10 to expose the portions of first ILD layer 236 that are to be removed. The exposed portions of first ILD layer 236 may be removed by a dry etching process.

In some embodiments, the dry etching process may be a fluorine based process. In some embodiments, the exposed portions of first ILD layer 236 overlying S/D regions 207 may be etched in two steps. In the first ILD etch step, etching may be performed using $CF_4$ gas at a flow rate ranging from about 100 sccm to about 500 sccm. In the second ILD etch step, etching may be performed using a gas mixture including $C_4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 10 mTorr to about 100 mTorr, and at an RF power ranging from about 500 W to about 800 W. In some embodiments, the first ILD etch step has a higher ILD etch rate than the second ILD etch step. The first ILD etch step may be used to etch a first sub-portion of the exposed portions of first ILD layer 236 at an etch rate that may be higher than the etch rate of the second ILD etch step used to etch a second sub-portion of the exposed portions.

The etching of first ILD layer 236 may be followed by a dry etching of portions of first etch stop layer 226 underlying the etched portions of first ILD layer 236. In some embodiments, these portions of first etch stop layer 226 may be etched in two steps. In the first etch step, etching may be performed using a gas mixture including $CH_2F_2$ gas at a flow rate ranging from about 5 sccm to about 50 sccm and $CF_4$ gas at a flow rate ranging from about 10 sccm to about 100 sccm. In the second etch step, etching may be performed using a gas mixture including $CH_3F$ gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step. The first etch step may be used to etch a first sub-portion of the portions of first etch stop layer 226 being etched at an etch rate that may be higher than the etch rate of the second etch step used to etch a second sub-portion of the portions of first etch stop layer 226.

In some embodiments, gate capping layer 120 may be removed after the etching of the portions of first etch stop layer 226. Removal of gate capping layer 120 may include patterning using photolithography the structure of FIG. 10 to expose the gate capping layer 120 that is to be removed. The exposed gate capping layer 120 may be removed by a dry etching process. In some embodiments, gate capping layer 120 may be etched in a manner similar to the above described two step etching process of the portions of first etch stop layer 226.

Alternatively, in some embodiments, patterning and etching of the portions of first ILD layer 235 and gate capping layer 120 may be performed simultaneously in the same processing step(s). Gate capping layer 120 may be partially etched when simultaneously etched with the portions of first ILD layer 236. The partially etched gate capping layer 120 may be subsequently removed during the two step etching of portions of first etch stop layer 226.

In some embodiments, formation of gate contact structure 238 and S/D conductive liners 230 and S/D first conductive regions 232 may further include deposition of materials of gate contact structure 238, S/D conductive liners 230, and S/D first conductive regions 232. Blanket deposition of the materials of conductive liners 230 and 240 may be done in the same processing step using, for example, PVD, CVD, ALD as these materials may be similar to each other, according to some embodiments. In some embodiments, conductive liners 230 and 240 each may include a single layer or a stack of conductive materials such as, for example, TiN, Ti, Ni, TaN, Ta, a suitable conductive material, or a combination thereof. The deposited materials may be thermally treated using, for example, a rapid thermal anneal process at a temperature ranging from about 500° C. to about 600° C. for a time period ranging from about 10 sec to about 20 sec. Deposition of conductive liners 230 and 240 may be followed by a deposition of the materials of conductive regions 232 and 242 performed in the same processing step using, for example, PVD, CVD, ALD as these materials may be similar to each other, according to some embodiments. In some embodiments, conductive regions 232 and 242 may include a conductive material such as, for example, W, Al, Co, Cu or a suitable conductive material.

Deposition of the materials of conductive liners 230 and 240 and conductive regions 232 and 242 may be followed by a CMP process to coplanarize top surfaces of conductive liners 230 and 240 and conductive regions 232 and 242 with top surface 236a of first ILD layer 236. In some embodiments, the CMP process, may use a silicon or an aluminum abrasive with abrasive concentrations ranging from about 0.1% to about 3%. In some embodiments, the silicon or aluminum abrasive may have a pH level less than 7 for W metal in conductive regions 232 and 242 or may have a pH level greater than 7 for Co or Cu metals in conductive regions 232 and 242.

Figure 12:
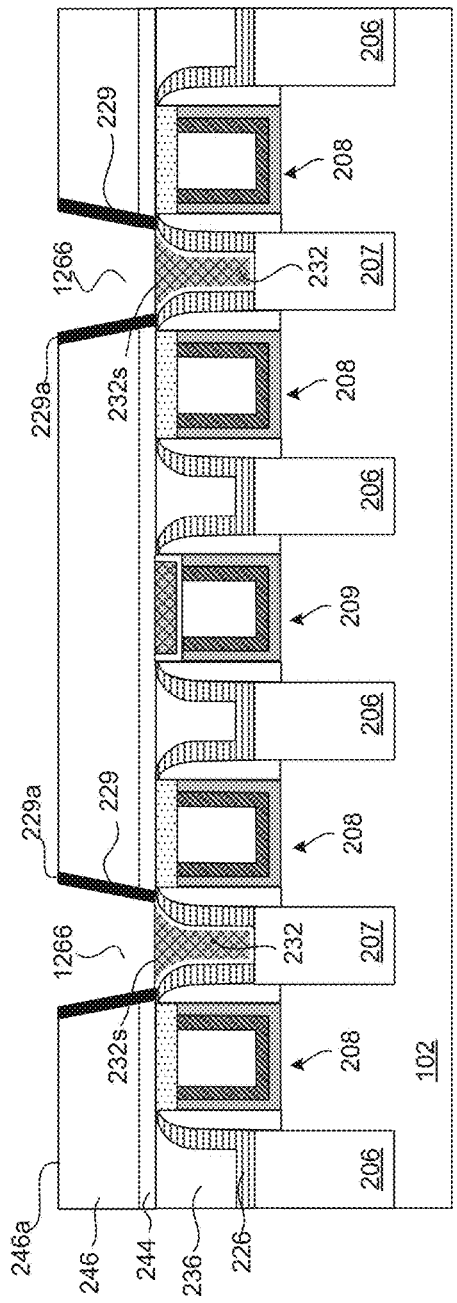

FIG. 12 is a cross-sectional view of a partially fabricated finFET 100 after the formation of contact openings 1266 and spacers 229 in second ILD layer 246 and second etch stop layer 244 on the structure of FIG. 11, according to some embodiments. Second etch stop layer 244 may be deposited on the structure of FIG. 11 followed by a deposition of second ILD layer 246 on second etch stop layer 244. Deposition processes of second etch stop layer 244 and second ILD layer 246 may be similar to the respective deposition processes of first etch stop layer 226 and first ILD layer 236 described above with reference to FIGS. 2 and 10.

Deposition of second ILD layer 246 may be followed by formation of contact openings 1266 within second ILD layer 246 and second etch stop layer 244. Contact openings 1266 may be formed on top surfaces 232s of first conductive regions 232. In some embodiments, formation of contact openings 1266 may include (i) patterning, using photolithography, top surface 246a of second ILD layer 246 to expose the portions of second ILD layer 246 overlying first conductive regions 232, (ii) etching the exposed portions of second ILD layer 246, and (iii) etching the portions of second etch stop layer 244 underlying the etched portions of second ILD layer 246 and overlying second conductive regions 232. In some embodiments, patterning and etching of second ILD layer 246 may be similar to the patterning and two step etching of first ILD layer 236 described above with reference to FIG. 11. In some embodiments, etching of second etch stop layer 244 may be similar to the two step etching of first etch stop layer 226 described above with reference to FIG. 11.

Optionally, in some embodiments, spacers 229 may be formed after the formation of contact openings 1266. Material of spacers 229 may be blanket deposited on the structure of FIG. 12 after the formation of contact openings 1266. In some embodiments, material of spacers 229 may include dielectric material such as, for example, silicon oxide, silicon carbide, silicon nitride, silicon oxy-nitride, or other suitable material. The deposited material may then be etched back to coplanarize top surfaces 229a of spacers 229 with top surface 246a and to remove deposited material of spacer 229 from top surfaces 232s of first conductive regions 232. Deposition and etching processes for the formation of spacers 229 may be similar to the deposition and etching processes of spacers 110 described above with reference to FIGS. 7-8.

Figure 13:
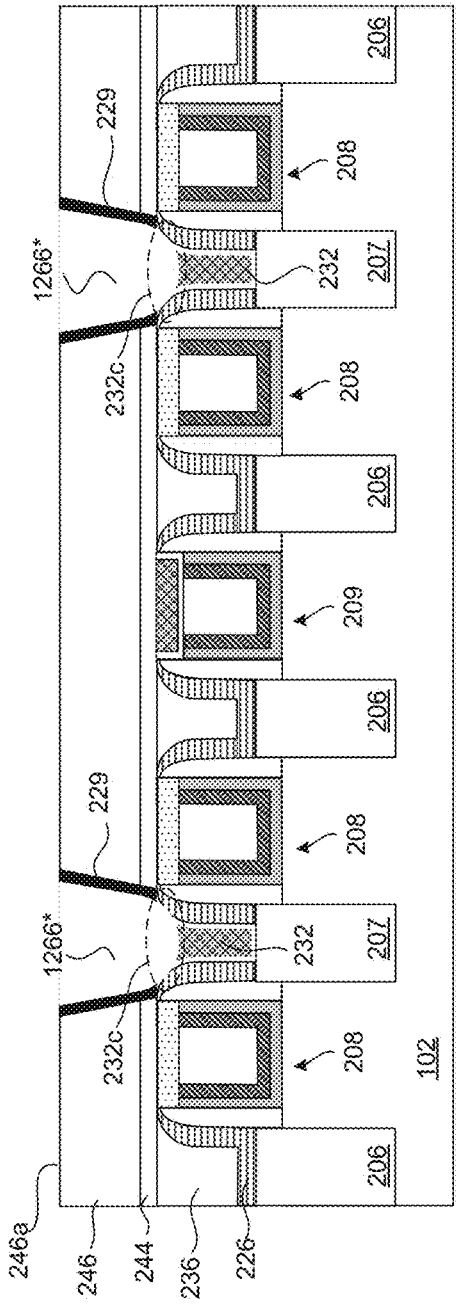

FIG. 13 is a cross-sectional view of a partially fabricated finFET 100 after the formation of concave top surfaces 232c of first conductive regions 232 to form contact openings 1266*, according to some embodiments. Concave top surfaces 232c may provide larger contact areas, and consequently, reduced contact resistance between first conductive regions 232 and second conductive regions 234 that may be subsequently formed within contact openings 1266*.

Formation of contact openings 1266* may include a plasma treatment of the structure of FIG. 12 followed by an etching process, according to some embodiments. The plasma treatment may include treating the structure of FIG. 12 after the formation of contact openings 1266 in $O_2$ gas flowing at a rate ranging from about 100 sccm to about 500 sccm for a time period ranging from about 1 sec to about 60 sec in an RIE chamber. The plasma treatment may be carried out under a pressure ranging from about 10 mTorr to about 100 mTorr, at a temperature ranging from about 10° C. to about 100° C., and at an RF power ranging from about 500 W to about 800 W. This plasma treatment may oxidize material of first conductive regions 232 from the top surfaces 232s up to a depth of about 1 nm to about 2 nm within first conductive regions 232. This oxide may be subsequently removed by, for example, a wet etching process.

In some embodiments, wet etching process to remove the oxidized material of first conductive regions 232 may include treating the plasma treated structure in a solution of deionized water and ozone (DI-$O_3$) for a time period ranging from about 5 sec to about 60 sec, followed by an acid etch in dilute hydrofluoric acid (HF) for a time period ranging from about 5 sec to about 60 sec and a subsequent treatment in a solution of carbonated deionized water (DI-$CO_2$) for a time period ranging from about 5 sec to about 60 sec. This wet etching process may be carried out at a temperature ranging from about 10° C. to about 60° C. In some embodiments, this wet etching process may be used for removing tungsten oxide ($WO_x$) formed in W-comprising conductive regions 232. During wet etching of $WO_x$, W may also be partially removed from W-comprising conductive regions 232 to form concave top surfaces 232c as shown in FIG. 13.

Alternatively, in some embodiments, the wet etching process to remove the oxidized material of first conductive regions 232 may include treating the plasma treated structure in a solution of benzoquinone ($C_6H_4O_2$), hydroxylamine ($H_3NO$), pentetic acid ($C_{14}H_{23}N_3O_{10}$), and benzotriazole ($C_6H_5N_3$) for a time period ranging from about 5 sec to about 60 sec at a temperature ranging from about 20° C. to about 60° C. In some embodiments, the wet etching process may be used for removing cobalt oxide ($CoO_x$) formed in Co-comprising conductive regions 232. During wet etching of $CoO_x$, Co may also be partially removed from Co-comprising conductive regions 232 to form concave top surfaces 232c as shown in FIG. 13.

In some embodiments, the concave shaped profile of top surfaces 232c may be a result of top surfaces 232s of conductive regions 232 being in contact with concave shaped menisci of the wet etchants during the wet etching process. The concave shaped menisci of the wet etchants may be formed due to capillary effects that may cause the wet etchants to adhere to the sidewalls of contact openings 1266 during the wet etching process. Additionally or alternatively, the concave shaped profile of top surfaces 232c may be a result of isotropic etching of the wet etching process. In addition to or in alternative to the meniscus shape and/or the isotropic etching, the concave shaped profile of top surfaces 232c may be a result of the different etch rates of ESL 226 and conductive regions 232. The etch selectivities of ESL 226 and conductive regions 232 may be different from each other and as a result, different thicknesses of ESL 226 and conductive regions 232 may be etched to form the concave shape of top surfaces 232c.

FIG. 14 is a cross-sectional view of a partially fabricated finFET 100 after the formation of second conductive regions 234, third etch stop layer 248, and third ILD layer 249 on the structure of FIG. 13, according to some embodiments. Second conductive regions 234 may be formed by a deposition of the material of second conductive regions 234 on the structure of FIG. 13 followed by a CMP process to coplanarize top surface 234s of second conductive regions 234 with top surface 246a of second ILD layer 246. Deposition and CMP processes for forming second conductive regions 234 may be similar to the deposition and CMP processes described above for first conductive regions 232 with reference to FIG. 11. In some embodiments, second conductive regions 234 may include a conductive material such as, for example, W, Al, Co, or Cu. First and second conductive regions 232 and 234 may have different conductive materials with respect to each other. Optionally, in some embodiments, top surfaces 234s of second conductive regions 234 may be treated to form concave top surfaces 234c as shown with dotted lines in FIG. 14. Concave top surfaces 234c may be formed by using a plasma treatment and a wet etching process similar to the plasma treatment and wet etching process used for forming concave top surfaces 232c described with reference to FIG. 13. Concave top surfaces 234c may help to provide larger contact areas for subsequent interconnects (e.g., interconnects 250 and 252) formed on second conductive regions 234 compared to contact areas provided by planar top surfaces 234s.

Formation of second conductive regions 234 may be followed by a deposition of third etch stop layer 248 and a subsequent deposition of third ILD layer 249. In some embodiments, deposition processes for forming third etch stop layer 248 and third ILD layer 249 may be similar to the respective deposition processes for second etch stop layer 244 and second ILD layer 246 described above with reference to FIG. 12.

FIG. 15 is a cross-sectional view of a partially fabricated finFET 100 after the formation of interconnects 250 and 252 in the structure of FIG. 14, according to some embodiments. Interconnects 250 may be formed on second conductive regions 234 using a dual damascene process to form dual damascene openings (not shown) within third etch stop layer 248 and third ILD layer 249 that may be subsequently filled with a conductive material. Interconnect 252 may be formed by etching portions of second and third ILD layers 246 and 249 and second and third etch stop layers 244 and 248 overlying gate contact structure 238 to form contact opening on conductive region 240, and subsequently, filling the contact opening with a conductive material. In some embodiments, conductive material may include W, Al, Co, Cu or a suitable conductive material. In some embodiments, interconnects 250 and 252 may be formed simultaneously or may be formed at different processing steps.

FIGS. 16-19 illustrate fabrication of finFET 100, having a cross-sectional view as described with reference to FIG. 3, at various stages of its fabrication, according to some embodiments. Fabrication steps illustrated in FIGS. 16-19 may subsequently follow the fabrication steps illustrated in FIGS. 1-10.

Figure 16:
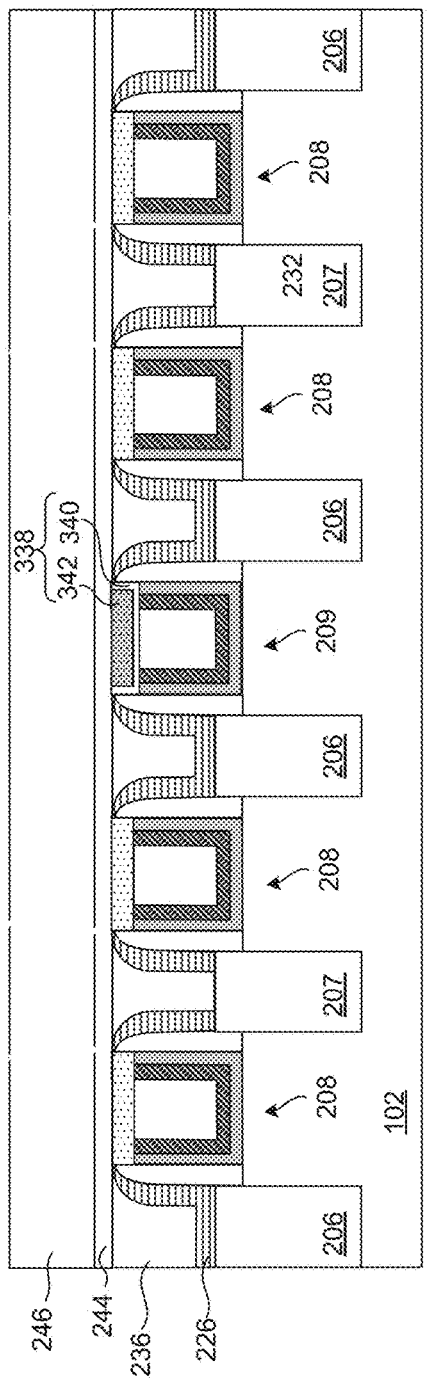

FIG. 16 is a cross-sectional view of a partially fabricated finFET 100 after the formation of gate contact structure 238, second etch stop layer 244, and second ILD layer 246 in the structure of FIG. 10, according to some embodiments. In some embodiments, formation of gate contact structure 338 may be similar to the formation of gate contact structure 238 described above with reference to FIG. 11. In some embodiments, formation of second etch stop layer 244 and second ILD layer 246 may be similar to the formation of second etch stop layer 244 and second ILD layer 246 described above with reference to FIG. 12.

Figure 17:
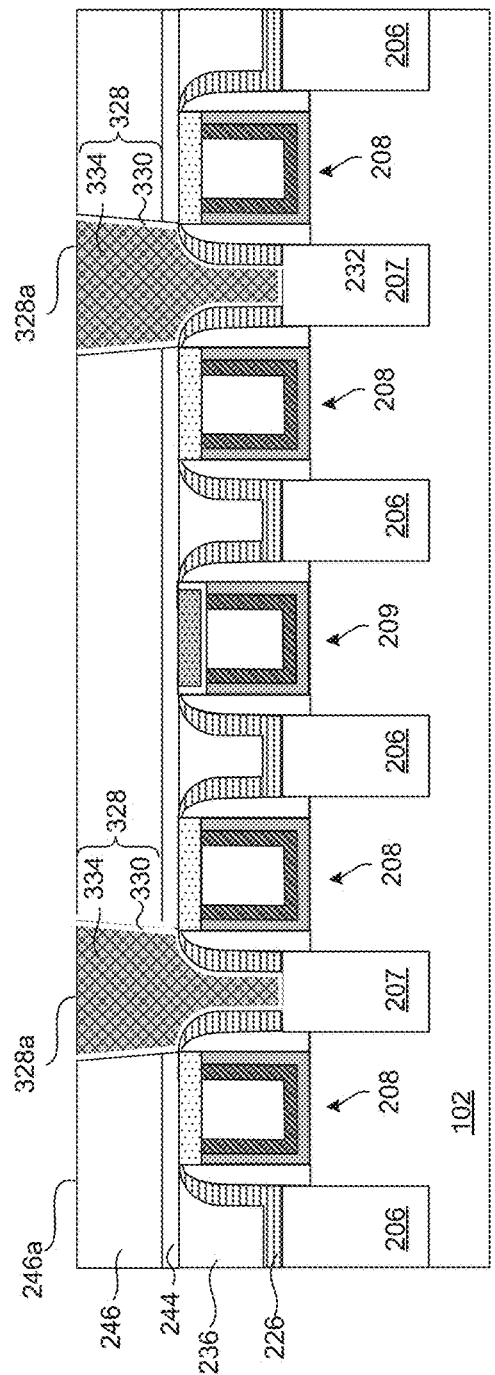

FIG. 17 is a cross-sectional view of a partially fabricated finFET 100 after the formation of S/D contact structures 328 in the structure of FIG. 16, according to some embodiments. Formation of S/D contact structures 328 may include formation of contact openings (not shown) within portions of first and second ILD layers 236 and 246 and within portions of first and second etch stop layers 226 and 244 overlying S/D regions 207. Contact openings may be formed by etching the portions of first and second ILD layers 236 and 246 and the portions of first and second etch stop layers 226 and 244 underlying the respective etched portions of first and second ILD layers 236 and 246. Etching of each these portions of first and second ILD layers 236 and 246 may be performed using the two step dry etching process described for first ILD layer 236 with reference to FIG. 11. Etching of each the portions of first and second etch stop layers 226 and 244 may be performed using the two step dry etching process described for first etch stop layers 226 with reference to FIG. 11.

Formation of S/D contact structures 328 may further include a first deposition of material of conductive liners 330 to line interior walls of contact openings as shown in FIG. 17 and a second deposition of material of conductive regions 334 to fill the lined contact openings formed on S/D regions 207. In some embodiments, material of conductive liners 330 may include TiN, Ti, Ni, TaN, Ta, or a combination thereof and may be deposited using, for example, PVD, CVD, or ALD. In some embodiments, material of conductive regions 334 may include W, Al, Co, Cu or a suitable conductive material and may be deposited using, for example, PVD, CVD, or ALD. First and second depositions may be followed by a CMP process to coplanarize top surface 328a of S/D contact structure 328 with top surface 246a of second ILD layer 246. CMP process may be similar to the CMP processes described above for conductive liners 230 and first conductive regions 232 with reference to FIG. 11.

Figure 18:
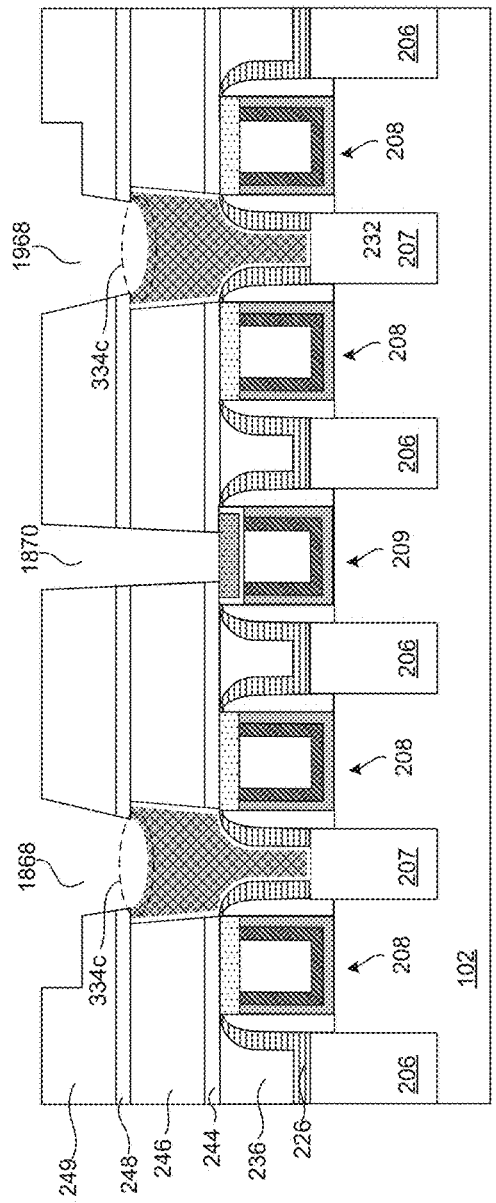

FIG. 18 is a cross-sectional view of a partially fabricated finFET 100 after the formation of concave top surfaces 334c of conductive regions 334 and contact openings 1868 and 1970 in the structure of FIG. 17, according to some embodiments. Concave top surfaces 334c may be formed by using a plasma treatment and a wet etching process similar to the plasma treatment and wet etching process used for forming concave top surfaces 232c described with reference to FIG. 13. Concave top surfaces 334c may help to provide larger contact areas for subsequent interconnects (e.g., interconnects 250 and 252) formed on conductive regions 334 compared to contact areas provided by planar top surfaces of conductive regions 334. Contact openings 1868 may be a dual damascene structure formed using a dual damascene process, according to some embodiments. For the formation of contact openings 1868 and 1870, a dry etching process similar to that described for first ILD layer 236 with reference to FIG. 11 may be used to etch second and third ILD layers 248 and 249. A dry etching process similar to that described for first etch stop layer 226 with reference to FIG. 11 may be used to etch second and third etch stop layers 244 and 248.

Figure 19:
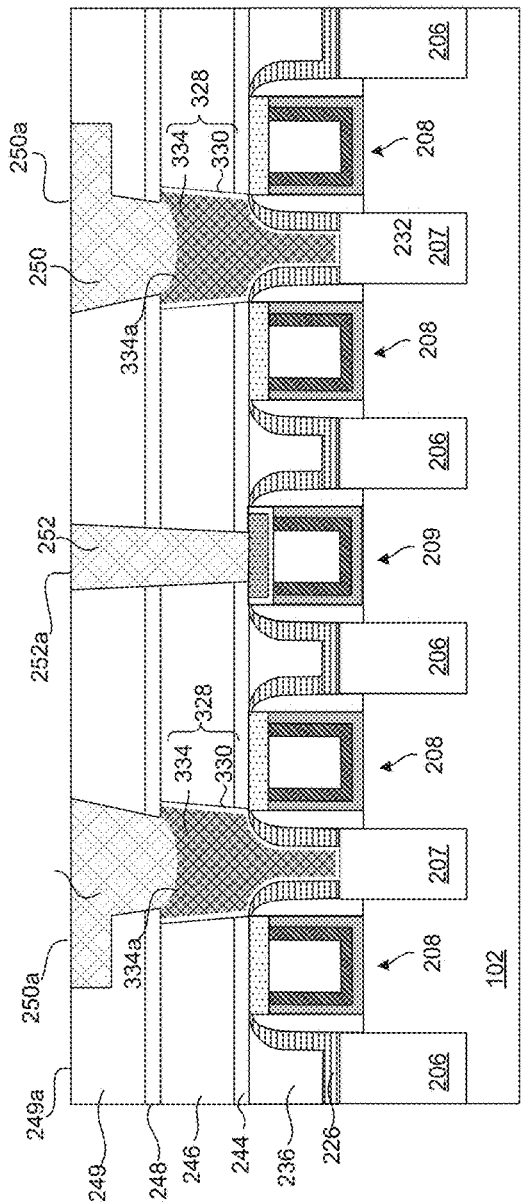

FIG. 19 is a cross-sectional view of a partially fabricated finFET 100 after the formation of interconnects 250 and 252 in the structure of FIG. 18, according to some embodiments. Formation of interconnects 250 and 252 may include a deposition of conductive material on the structure of FIG. 18 followed by a CMP process to coplanarize top surfaces 250a and 252a of interconnects 250 and 252 with top surface 249a of third ILD layer 249.

Figure 20:
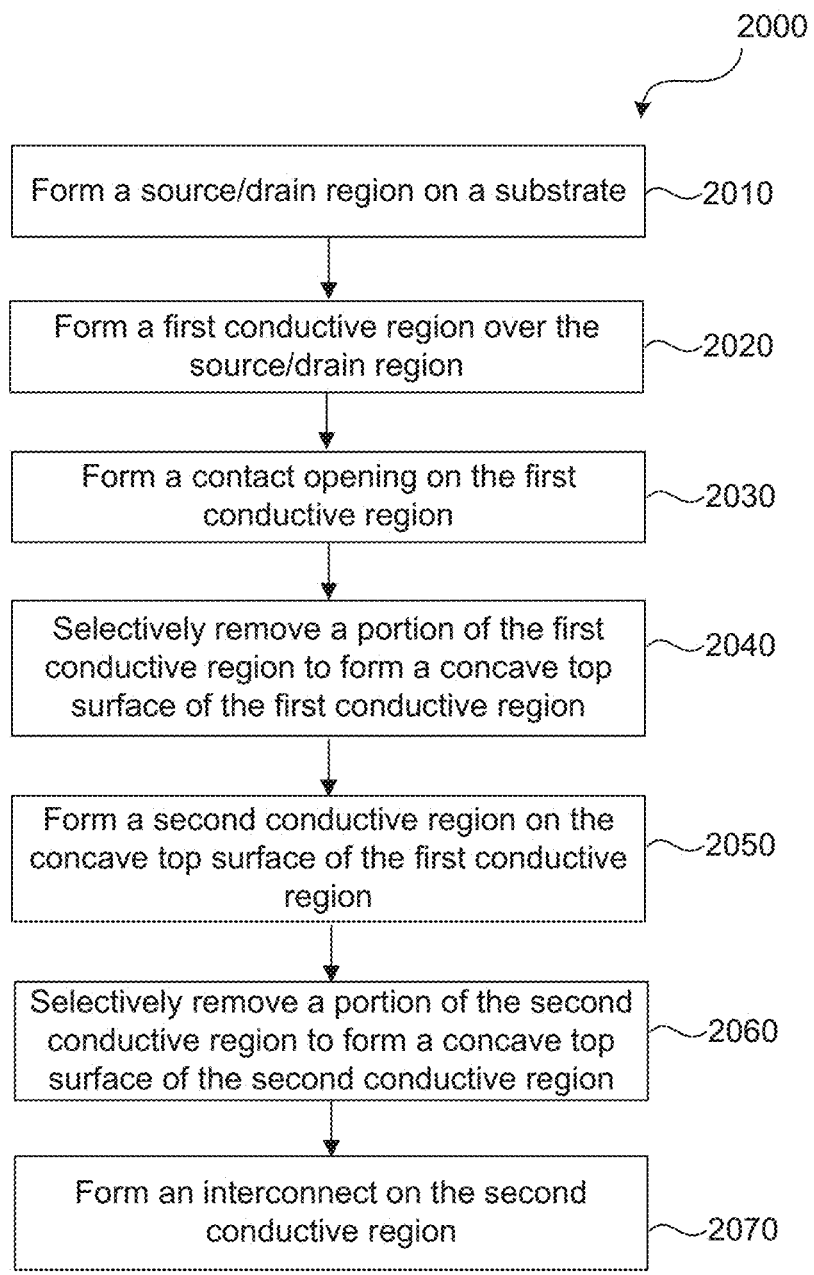
FIG. 20 is flow diagram of a method for fabricating a fin field effect transistor (finFET), in accordance with some embodiments.

FIG. 20 is a flow diagram of an exemplary method 2000 for fabricating finFET 100, according to some embodiments. Solely for illustrative purposes, the operations illustrated in FIG. 20 will be described with reference to the example fabrication process illustrated in FIGS. 4-15. Operations can be performed in a different order or not performed depending on specific applications. It should be noted that method 2000 does not produce a complete finFET 100. Accordingly, it is understood that additional processes may be provided before, during, and after method 2000, and that some other processes may only be briefly described herein.

In operation 2010, a source/drain (S/D) region is formed on a substrate. For example, in FIG. 9, S/D regions 207 may be formed on recessed fin portions 862 of fin regions 504 formed on a substrate 102. Semiconductor material of S/D regions 207 may be selectively epitaxially-grown over recessed fin portions 862. In some embodiments, the selective epitaxial growth of the semiconductor material of S/D regions 207 may continue until the semiconductor material extends vertically a distance in a range from about 10 nm to about 100 nm above top surface 102s of substrate 102 and extends laterally over top surfaces 112t of some of STI regions 112. The epitaxial processes for growing the semiconductor material may include CVD deposition techniques (e.g., LPCVD, vapor-phase epitaxy (VPE), and/or ultra-high vacuum CVD (UHV-CVD)), molecular beam epitaxy, and/or other suitable processes. The semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, p-type S/D regions 207 may include SiGe and may be in-situ doped during an epitaxial growth process using p-type dopants such as, for example, boron, indium, or gallium. In some embodiments, n-type S/D regions 207 may include Si and may be in-situ doped during an epitaxial growth process using n-type dopants such as, for example, phosphorus or arsenic.

In operation 2020, a first conductive region is formed over the source/drain region. For example, in FIG. 11, first conductive region 232 may be formed over S/D regions 207. Formation of first conductive regions 232 may include removing portions of first ILD layer 236 overlying S/D regions 207 and removing portions of first etch stop layer 226 underlying the etched portion of first ILD layer 236. Removal of portions of first ILD layer 236 overlying S/D regions 207 may include patterning to expose the portions of first ILD layer 236 that are to be removed. The exposed portions of first ILD layer 236 may be removed by a fluorine based dry etching process. The etching of first ILD layer 236 may be followed by a dry etching of portions of first etch stop layer 226 underlying the etched portions of first ILD layer 236. Formation of first conductive regions 232 may further include deposition of materials of first conductive regions 232. Deposition of the materials of first conductive regions 232 may be performed using, for example, PVD, CVD, or ALD. In some embodiments, first conductive regions 232 may include a conductive material such as, for example, W, Al, Co, Cu or a suitable conductive material. Deposition of the materials of first conductive regions 232 may be followed by a CMP process to coplanarize top surfaces of first conductive regions 232 with top surface 236a of first ILD layer 236. In some embodiments, the CMP process may use a silicon or an aluminum abrasive with abrasive concentrations ranging from about 0.1% to about 3%.

In operation 2030, a contact opening is formed on the first conductive region. For example, in FIG. 12, contact openings 1266 may be formed on first conductive regions 232. Contact openings 1266 may be formed within second ILD layer 246 and second etch stop layer 244. Contact openings 1266 may be formed on top surfaces 232s of first conductive regions 232. In some embodiments, formation of contact openings 1266 may include (i) patterning, using photolithography, top surface 246a of second ILD layer 246 to expose the portions of second ILD layer 246 overlying first conductive regions 232, (ii) etching the exposed portions of second ILD layer 246 using a fluorine based dry etching process, and (iii) etching the portions of second etch stop layer 244 underlying the etched portions of second ILD layer 246 and overlying second conductive regions 232 using a fluorine based dry etching process.

In operation 2040, a portion of the first conductive region is selectively removed to form a concave top surface of the first conductive region. For example, in FIG. 13, concave top surfaces 232c may be formed. Formation of concave top surfaces 232c may include a plasma treatment of first conductive region 232 followed by an etching process, according to some embodiments. The plasma treatment may include treating first conductive region 232 in $O_2$ gas flowing at a rate ranging from about 100 sccm to about 500 sccm for a time period ranging from about 1 sec to about 60 sec in an RIE chamber. The plasma treatment may be carried out under a pressure ranging from about 10 mTorr to about 100 mTorr, at a temperature ranging from about 10° C. to about 100° C., and at an RF power ranging from about 500 W to about 800 W. This plasma treatment may oxidize material of first conductive regions 232 from the top surfaces 232s up to a depth of about 1 nm to about 2 nm within first conductive regions 232. This oxide may be subsequently removed by, for example, a wet etching process.

In operation 2050, a second conductive region is formed on concave top surface of the first conductive region. For example, in FIG. 14, second conductive regions 234 may be formed on concave top surfaces 232c of first conductive regions 232. Second conductive regions 234 may be formed by a deposition of the material of second conductive regions 234 on the structure post operation 2050 followed by a CMP process to coplanarize top surfaces 234s of second conductive regions 234 with top surface 246a of second ILD layer 246. Deposition and CMP processes for forming second conductive regions 234 may be similar to the deposition and CMP processes described above for first conductive regions 232 in operation 2020. In some embodiments, second conductive regions 234 may include a conductive material such as, for example, W, Al, Co, or Cu.

In operation 2060, a portion of the second conductive region is selectively removed to form a concave top surface of the second conductive region. For example, in FIG. 14, concave top surfaces 234c may be formed. Concave top surfaces 234c may be formed by using a plasma treatment and a wet etching process similar to the plasma treatment and wet etching process used for forming concave top surfaces 232c described above in operation 2040.

In operation 2070, an interconnect is formed on the second conductive region. For example, in FIG. 15, interconnects 250 may be formed on second conductive regions 234. Interconnects 250 may be formed on second conductive regions 234 using a dual damascene process to form dual damascene openings within third etch stop layer 248 and third ILD layer 249 that may be subsequently filled with a conductive material. In some embodiments, conductive material may include W, Al, Co, Cu or a suitable conductive material.

The above embodiments describe structures and methods for reducing contact resistance between contact structures (e.g., source/drain (S/D) contact structures 228 and/or 328) of field effect transistors (e.g., finFET 100, MOSFETs) and interconnect(s) (e.g., interconnects 250) of an integrated circuit including the field effect transistors. Such embodiments provide a larger contact area, and hence reduced contact resistance between the contact structures and the interconnects compared to other field effect transistors. Such reduction in contact resistance is achieved without an increase in critical dimension (e.g., line widths) of the field effect transistors. Some of the embodiments are described below.

A method of forming a semiconductor device includes forming a source/drain region on a substrate and forming a first interlayer dielectric (ILD) layer over the source/drain region. The method further includes forming a first conductive region within the first ILD layer, selectively removing a portion of the first conductive region to form a concave top surface of the first conductive region. The method also includes forming a second ILD layer over the first ILD layer and forming a second conductive region within the second ILD layer and on the concave top surface.

A method of forming a semiconductor device includes forming a source/drain region on a substrate and forming first and second conductive regions on the source/drain region. The method further includes forming a concavely curved interface between the first and second conductive regions and forming insulating spacers on sidewalls of the second conductive region.

A semiconductor device includes a fin structure on a substrate, an epitaxial source/drain region on the fin structure, and a source/drain contact structure. The source/drain region includes a first conductive region over the source/drain region, a second conductive region on the first conductive region, and a concavely curved interface between the first and second conductive regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a source/drain region on a substrate;
   forming a first interlayer dielectric (ILD) layer over the source/drain region;
   forming a first conductive region within the first ILD layer;
   selectively removing a portion of the first conductive region to form a concave top surface of the first conductive region;
   forming a second ILD layer over the first ILD layer; and
   forming a second conductive region within the second ILD layer and on the concave top surface.

2. The method of claim 1, wherein the selectively removing the portion of the first conductive region comprises:
   treating the portion of the first conductive region in an oxygen plasma; and
   wet etching the oxygen plasma treated portion to form the concave top surface.

3. The method of claim 2, wherein the treating the portion of the first conductive region in the oxygen plasma comprises:
   maintaining an oxygen gas flow rate at a range from about 100 standard cubic centimeters per minute (sccm) to about 500 sccm; and
   maintaining a temperature of about 10° C. to about 100° C.

4. The method of claim 2, wherein the wet etching the oxygen plasma treated portion comprises using a solution of deionized water and ozone, dilute hydrofluoric acid, and carbonated deionized water.

5. The method of claim 1, wherein the selectively removing the portion of the first conductive region comprises:
   oxidizing the portion of the first conductive region in oxygen plasma; and
   wet etching the oxidized portion of the first conductive region to form the concave top surface.

6. The method of claim 1, further comprising:
   selectively removing a portion of the second conductive region to form a concave top surface of the second conductive region.

7. The method of claim 6, wherein the selectively removing the portion of the second conductive region comprises:
   oxidizing the portion of the second conductive region in oxygen plasma; and
   wet etching the oxidized portion of the second conductive region to form the concave top surface of the second conductive region.

8. The method of claim 1, further comprising:
   forming insulating spacers along sidewalls of the second conductive region.

9. The method of claim 1, wherein the forming the first conductive region within the first ILD layer comprises etching a portion of the first ILD layer over the source/drain region, the etching comprising:
   etching a first sub-portion at a first etch rate; and etching a second sub-portion at a second etch rate slower than the first etch rate.

10. The method of claim 1, wherein the forming the source/drain region comprises:
   forming a fin structure on the substrate;
   etching a portion of the fin structure to form a recessed fin region; and
   epitaxially growing the source/drain region on the recessed fin region.

11. The method of claim 1, further comprising:
   forming a fin structure on the substrate;
   forming a metal gate structure on the fin structure; and
   forming a third conductive region over the gate structure, wherein the first and third conductive regions are formed concurrently.

12. A method of forming a semiconductor device, the method comprising:
   forming a source/drain region on a substrate;
   forming first and second conductive regions on the source/drain region;
   forming a concavely curved interface between the first and second conductive regions; and
   forming insulating spacers on sidewalls of the second conductive region.

13. The method of claim 12, wherein the forming the concavely curved interface comprises selectively removing a portion of the first conductive region to form a concave top surface of the first conductive region.

14. The method of claim 13, wherein the selectively removing the portion of the first conductive region comprises:
   treating the portion of the first conductive region in an oxygen plasma; and
   wet etching the plasma treated portion to form the concave top surface.

15. The method of claim 12, further comprising:
   selectively removing a portion of the second conductive region to form a concave top surface of the second conductive region.

16. The method of claim 12, further comprising:
   forming a first interlayer dielectric (ILD) layer over the source/drain region; and
   forming a second ILD layer over the first ILD layer, wherein:
      the first conductive region is formed within the first ILD layer; and
      the second conductive region is formed within the second ILD layer.

17. A method for forming electrical connection between a source/drain region and a metal interconnect in a semiconductor structure, comprising:
   forming a first interlayer dielectric layer (IDL) over the source/drain region;
   forming a first conductive region in the first ILD and above the source/drain region;
   forming a second IDL over the first IDL; and
   forming a second conductive region in the second IDL and above the first conductive region and the metal interconnect, the second IDL including a dual-damascene structure, wherein forming the first conductive region and the second conductive region comprises forming a concavely curved interface in at least one of the first conductive region and the second conductive region.

18. The method of claim 17, wherein forming the concavely curved interface comprises selectively removing a portion of at least one of the first conductive region and the second conduction region.

19. The method of claim 18, wherein selectively removing the portion comprises:
   treating the portion in an oxygen plasma; and
   wet etching the oxygen plasma treated portion to form a concavely curved top surface.

20. The method of claim 19, wherein:
   the treating the oxygen plasma treated portion comprises maintaining an oxygen gas flow rate at a range from about 100 standard cubic centimeters per minute (sccm) to about 500 sccm and maintaining a temperature of about 10° C. to about 100° C.; and
   the wet etched, oxygen plasma treated portion comprises a solution of deionized water and ozone, dilute hydrofluoric acid, and carbonated deionized water.

* * * * *